US012658932B2

(12) United States Patent
Cristofoli et al.

(10) Patent No.: US 12,658,932 B2
(45) Date of Patent: Jun. 16, 2026

(54) NOISE-SHAPING SAR ADC WITH MULTI-INPUT AMPLIFIER AND MULTI-INPUT COMPARATOR

(71) Applicants: Politecnico Di Milano, Milan (IT); Infineon Technologies AG, Neubiberg (DE)

(72) Inventors: Andrea Cristofoli, Villach (AT); Gabriele Be', Adro (IT); Gabriele Zanoletti, Clusone (IT); Luca Bertulessi, Monza (IT)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 18/670,089

(22) Filed: May 21, 2024

(65) Prior Publication Data

US 2025/0364999 A1     Nov. 27, 2025

(51) Int. Cl.
H03M 1/06 (2006.01)
H03M 1/08 (2006.01)
(52) U.S. Cl.
CPC ..................................... H03M 1/08 (2013.01)
(58) Field of Classification Search
CPC ........ H03M 1/08; H03M 1/0617; H03M 1/10; H03M 1/144

USPC ................................. 341/155, 144, 120, 118
See application file for complete search history.

(56) References Cited

U.S. PATENT DOCUMENTS 4,870,416 A * 9/1989 Mapleston .............. H03M 1/16
                                                    341/110
2009/0167578 A1* 7/2009 Takahashi ........... H03M 1/1033
                                                    341/120

OTHER PUBLICATIONS

Fredenburg, Jeffrey A., et al., "A 90-MS/s 11-MHz-Bandwidth 62-dB SNDR Noise-Shaping SAR ADC", IEEE Journal of Solid-State Circuits, vol. 47, No. 12, Dec. 2012, 7 pages.

(Continued)

*Primary Examiner* — Peguy Jean Pierre
(74) *Attorney, Agent, or Firm* — Slater Matsil, LLP

(57) ABSTRACT

In accordance with an embodiment, a noise shaping successive approximation analog-to-digital converter (ADC) includes: a digital-to-analog converter (DAC); a multi-input comparator with a first input coupled to the DAC; a multi-input amplifier having a first input coupled to the DAC, and a second input coupled to a second input of the multi-input comparator; and a first delay element having an input coupled to an output of the multi-input amplifier and an output coupled to the second input of the multi-input amplifier and to the second input of the multi-input comparator.

20 Claims, 10 Drawing Sheets

(56)          References Cited

OTHER PUBLICATIONS

Jie, Lu et al., "A Cascaded Noise-Shaping SAR Architecture for Robust Order Extension", IEEE Journal of Solid-State Circuits, vol. 55, No. 12, Dec. 2020, 12 pages.

Jie, Lu et al., "A Calibration-Free Time-Interleaved Fourth-Order Noise-Shaping SAR ADC", IEEE Journal of Solid-State Circuits, vol. 54, No. 12, Dec. 2019, 10 pages.

Li, Shaolan et al., "A 13-ENOB Second-Order Noise-Shaping SAR ADC Realizing Optimized NTF Zeros Using the Error-Feedback Structure", IEEE Journal of Solid-State Circuits, vol. 53, No. 12, Dec. 2018, 13 pages.

Liu, Chun-Cheng et al., "A 0.46mW 5MHz-BW 79.7dB-SNDR Noise-Shaping SAR ADC with Dynamic-Amplifier-Based FIR-IIR Filter", ISSCC 2017 / Session 28/ Hybrid ADCs / 28.1, IEEE International Solid-State Circuits Conference, Feb. 27, 2017, 3 pages.

* cited by examiner

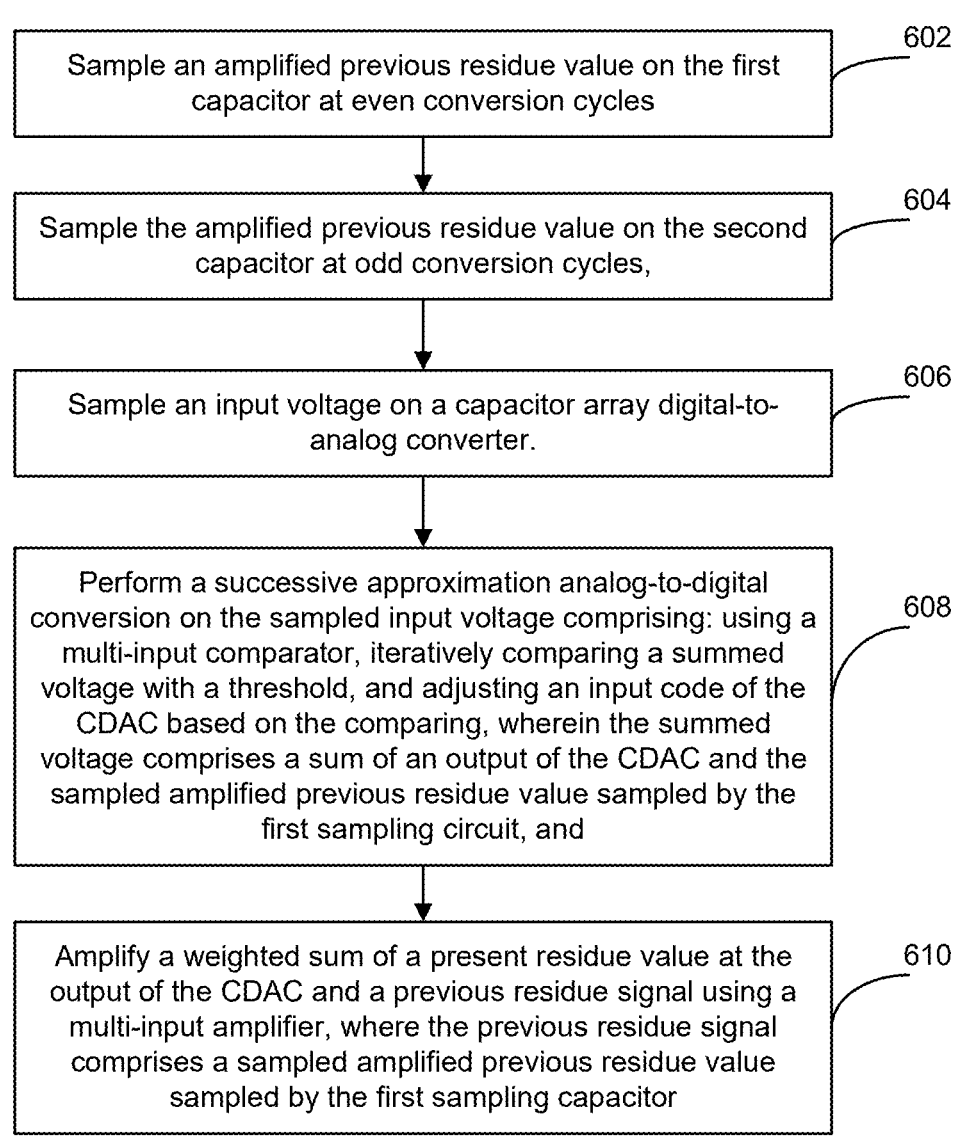

600

602
Sample an amplified previous residue value on the first capacitor at even conversion cycles 604
Sample the amplified previous residue value on the second capacitor at odd conversion cycles, 606
Sample an input voltage on a capacitor array digital-to-analog converter.

608
Perform a successive approximation analog-to-digital conversion on the sampled input voltage comprising: using a multi-input comparator, iteratively comparing a summed voltage with a threshold, and adjusting an input code of the CDAC based on the comparing, wherein the summed voltage comprises a sum of an output of the CDAC and the sampled amplified previous residue value sampled by the first sampling circuit, and 610
Amplify a weighted sum of a present residue value at the output of the CDAC and a previous residue signal using a multi-input amplifier, where the previous residue signal comprises a sampled amplified previous residue value sampled by the first sampling capacitor

*FIG. 6*

NOISE-SHAPING SAR ADC WITH MULTI-INPUT AMPLIFIER AND MULTI-INPUT COMPARATOR

TECHNICAL FIELD

The present invention relates generally to an electronic system, and, in particular embodiments, to a noise shaping successive approximation ADC with a multi-input amplifier and a multi-input comparator.

BACKGROUND

Analog-to-digital converters (ADCs) are integral components in many electronic systems, serving to convert continuous analog signals into discrete digital values for further processing. Among various types of ADCs, successive approximation register (SAR) ADCs are widely used due to their low power consumption and compact size. These converters operate by approximating the input signal through a series of search steps, each refining the previous approximation.

In recent years, noise-shaping techniques have been incorporated into SAR ADCs to improve their performance. Noise shaping is a method to enhance the signal-to-noise ratio by shaping the spectral density of quantization noise. In the context of SAR ADCs, noise shaping can be achieved through error-feedback (EF) architectures, where the quantization error from the previous conversion cycle is fed back and subtracted from the current input signal. This feedback mechanism effectively pushes the quantization noise to higher frequencies, thereby improving the signal-to-noise ratio within the signal bandwidth.

SUMMARY

In accordance with an embodiment, a noise shaping successive approximation analog-to-digital converter (ADC) includes: a digital-to-analog converter (DAC); a multi-input comparator with a first input coupled to the DAC; a multi-input amplifier having a first input coupled to the DAC, and a second input coupled to a second input of the multi-input comparator; and a first delay element having an input coupled to an output of the multi-input amplifier and an output coupled to the second input of the multi-input amplifier and to the second input of the multi-input comparator.

In accordance with an embodiment, a method includes performing an analog-to-digital conversion by: using a first sampling circuit having a first capacitor and a second capacitor, sampling an amplified previous residue value on the first capacitor at even conversion cycles and sampling the amplified previous residue value on the second capacitor at odd conversion cycles; sampling an input voltage on a capacitor array digital-to-analog converter (CDAC); and performing a successive approximation analog-to-digital conversion on the sampled input voltage by: using a multi-input comparator, iteratively comparing a summed voltage with a threshold, and adjusting an input code of the CDAC based on the comparing, where the summed voltage comprises a sum of an output of the CDAC and the sampled amplified previous residue value sampled by the first sampling circuit. The method also includes, after performing the successive approximation analog-to-digital conversion, amplifying a weighted sum of a present residue value at the output of the CDAC and a previous residue signal using a multi-input amplifier, where the previous residue signal comprises a sampled amplified previous residue value sampled by the first sampling circuit.

In accordance with an embodiment, an analog-to-digital converter may include: a first sampling circuit having a first capacitor and a second capacitor, the first sampling circuit configured to sample an amplified previous residue value on the first capacitor at even conversion cycles, and sample the amplified previous residue value on the second capacitor at odd conversion cycles; a successive approximation analog-to-digital converter having a capacitor array digital-to-analog converter (CDAC), a multi-input comparator, and a successive approximation register, the successive approximation analog-to-digital converter configured to perform a successive approximation analog-to-digital conversion on a sampled input voltage by: iteratively comparing a summed voltage with a threshold, and adjusting an input code of the CDAC based on the comparing, where the summed voltage comprises a sum of an output of the CDAC and the sampled amplified previous residue value sampled by the first sampling circuit; and a multi-input amplifier configured to amplify a present residue value at the output of the CDAC and a previous residue signal, where the previous residue signal comprises a sampled amplified previous residue value sampled by the first sampling circuit.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a flowchart of an embodiment method of performing an analog-to-digital conversion.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are directed to an architecture for a noise-shaping successive-approximation register (NS-SAR) analog-to-digital converter (ADC) that includes a multi-input amplifier (MIA) that is used in conjunction with sampling capacitors to amplify and sample the amplified residue at the end of a successive approximation conversion, and a multi-input comparator (MIC) that sums the sampled residue with the intermediate residues that are generated during the course of a successive approximation conversion. The noise transfer function (NTF) of the NS-SAR ADC can be set by selecting the absolute gains of the MIA and the relative gains of the MIC inputs, as well as by selecting the number of sampling capacitors and the timing of the sampling within the noise shaping loop.

By amplifying the residue with an MIA prior to its sampling, the relative noise contribution of the capacitors within the noise shaping loop can be advantageously reduced. Reducing the noise contribution of these capacitors further advantageously allows for the reduction of circuit area and power consumption in some embodiments.

Figure 1A:
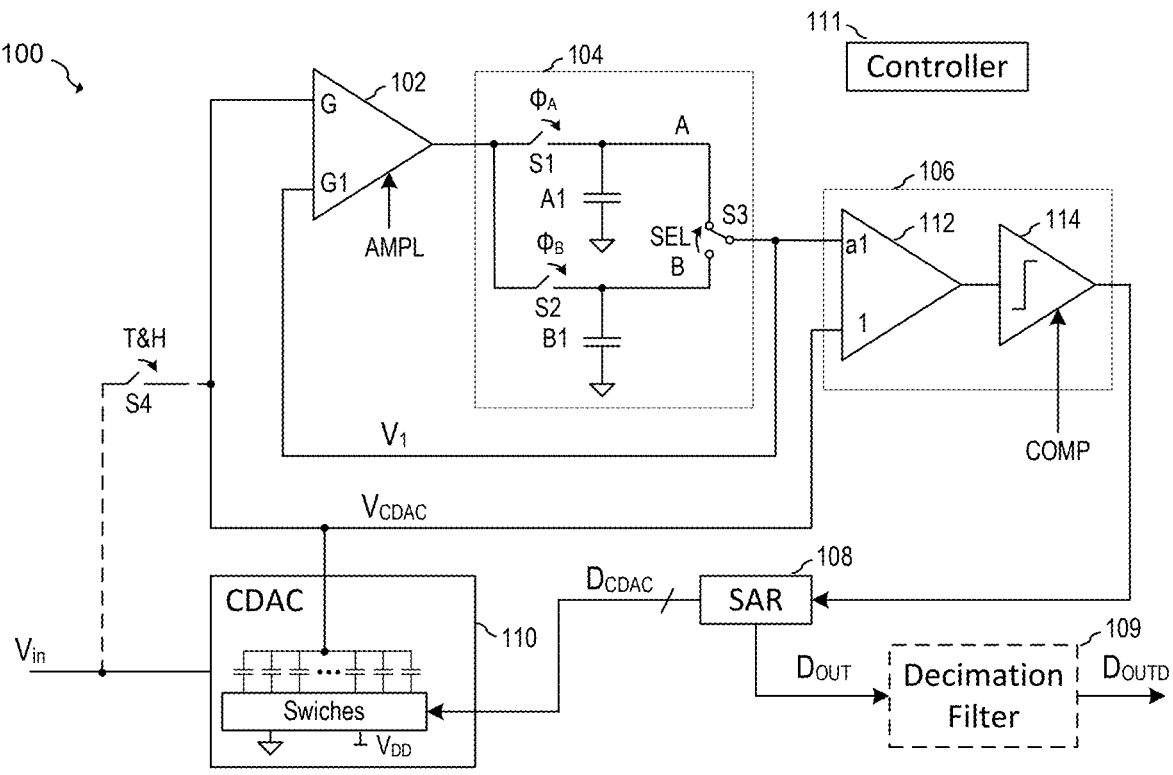
FIG. 1A illustrates a schematic of a noise shaping successive approximation register analog-to digital converter (NS-SAR ADC) according to an embodiment.

FIG. 1A illustrates a schematic of a noise shaping successive approximation register analog-to digital converter (NS-SAR ADC) 100 that includes MIA 102, delay element 104, MIC 106, CDAC 110, SAR 108 and optional decimation filter 109.

As shown, the output $V_{CDAC}$ of CDAC 110 is coupled to one input of MIC 106 and to one input of MIA 102, the output of MIC 106 is coupled to SAR 108, and the output of SAR 108 is coupled to the data input of CDAC 110 via multi-bit digital signal $D_{CDAC}$. Together CDAC 110, MIC 106 and SAR 108 form, and are configured to perform the function of, a successive approximation ADC.

Between successive approximation conversions, MIA 102 determines a weighted sum of the residue of a just-completed successive approximation conversion and a previously stored amplified residue from a previous cycle on one of capacitors A1 and B1 of delay element 104. Accordingly, a previously stored amplified residue is applied to one of the inputs of MIC 106. Applying the previously stored amplified residue to the input of MIC 106 implements a noise shaping loop that lowers the noise floor at lower frequencies. Amplifying the residue by MIA 102 prior to its being sampled reduces the effect of kT/C noise generated by capacitors A1 and B1 and allows these sampling capacitors to be physically small in some embodiments. Moreover, optional decimation filter 109 may be used to filter out the shaped high frequency noise present at digital output Dour to form filtered signal $D_{OUTD}$.

As shown, MIA 102 includes two inputs "G" and "G1" representing two voltage gains, such that the voltage output of MIA 102 can be represented as the weighted sum: $G*V_{CDAC}+G_1*V_1$. While MIA 102 is shown having only two inputs, it should be understood that MIA 102 may have three or more inputs depending on the particular embodiments and its specifications, as discussed with embodiments below.

MIC 106 includes a multi-input pre-amplifier 112 followed by a comparator 114. Similar to the MIA 102, multi-input pre-amplifier 112 has two inputs "a1" and "1" representing two voltage gains such that the output of multi-input pre-amplifier 112 can be represented as the weighted sum: $a1*V_1+V_{CDAC}$. In some embodiments, gains "a1" and "1" represent relative and not absolute gains. Again, while MIC 106 is shown having only two inputs, it should be understood that MIC 106 may have three or more inputs depending on the particular embodiments and its specifications, as discussed with respect to embodiments below. Comparator 114 may be implemented using comparator circuits known in the art including, but not limited to an amplifier, an amplifier with positive feedback and/or a latch circuit. As shown, comparator 114 is clocked or activated via signal COMP. This COMP signal may cause comparator 114 to perform a comparison on the rising edge, falling edge or while the COMP signal is active depending on the structure of comparator 114.

In some embodiments, MIA 102 and multi-input pre-amplifier 112 may be implemented using a switched capacitor amplifier having multiple parallel input stages. In some embodiments, each of these amplifiers may be implemented using a floating inverter dynamic amplifier (FIDA), such as is described with respect to FIGS. 5A and 5B below; however, other switched capacitor amplifier structures could be used. In the depicted embodiment, the output of MIA 102 is activated when control signal AMPL is asserted. Alternatively, other amplifier circuits known in the art may be used. For example, MIA 102 and/or multi-input pre-amplifier 112 may be implemented using a continuous-time amplifier having parallel input stages (such as parallel differential pairs).

CDAC 110 can be implemented using a capacitor array and a set of switches connected to the capacitor array. One end of each capacitor is connected to a common node $V_{CDAC}$, which forms the output of the CDAC 110. This common node may be connected to the top plates of the capacitors. The states of these switches are digitally controlled by the output of a successive approximation register (SAR) 108. By controlling the voltages applied to the bottom plates of the capacitors through the switch configuration, the output voltage $V_{CDAC}$ of the CDAC 110 can be digitally adjusted. This digital adjustment is achieved by selectively connecting the bottom plates of the capacitors to different voltage levels, thereby varying the charge stored on the capacitors and, consequently, the output voltage $V_{CDAC}$. It should be understood that the structure and connections to CDAC 110 shown in FIG. 1A is just one of example of various possible implementations. For example, in alternative embodiments, the bottom plates of the capacitors can be connected to other reference signals aside from the depicted power and ground nodes.

In some embodiments, CDAC 110 may be configured to sample input voltage $V_{in}$ on the shared top plate of the capacitor array, for example, using switch S4 coupled to node $V_{CDAC}$. As shown, voltage $V_{in}$ is applied to node $V_{CDAC}$ when track and hold signal T&H is activated, for example prior to a successive approximation conversion.

However, node $V_{in}$ would not be directly connected to CDAC 110 in this implementation. The signal path between node $V_{in}$ and node $V_{CDAC}$ is shown in dashed lines to indicate that this is an optional implementation. In alternative embodiments, input voltage $V_{in}$ may be sampled on the bottom plates of the capacitor array, in which case switch S4 would not be present and the top-plate node $V_{CDAC}$ would be connected to a fixed voltage, such as a common mode voltage $V_{cm}$. In further alternative embodiments voltage $V_{IN}$ may be sampled using a sample and hold circuit and/or a separate sampling capacitor (not shown) that is separate from CDAC 110.

SAR 108 may be implemented using a SAR circuit known in art. For example, SAR 108 may include register circuits and/or shift register circuits and control logic configured to implement a successive approximation conversion. In various embodiments, the number of bits of SAR 108 may correspond to the number of bits of the successive approximation conversion.

In various embodiments, delay element 104 provides a one-sample length delay of the output of MIA 102. As shown, this delay may be implemented by sampling the output of MIA 102 on capacitors A1 and B1 in an alternating manner. For example, during odd sampling cycles, the output of MIA 102 is sampled on capacitor A1 via switch S1 controlled by switching signal $\Phi_A$. In this odd sampling cycle, capacitor B1 is connected to the G1 input of MIA 102 and to the a1 input of MIC 106 via switch S3 in position B. During the next even cycle, the voltage of capacitor A1 at node A is coupled to the a1 input of MIC 106 and to the G1 input of MIA 102 via switch S3 controlled by signal SEL. Similarly, during even sampling cycles, the output of MIA 102 is sampled on capacitor B1 via switch S2 controlled by switching signal $\Phi_B$, and during the next odd cycle, node B is coupled to the a input of MIC 106 and to the G1 input of MIA 102 via switch S3 controlled by signal SEL. In some embodiments, switch S3 may be implemented using two switches: a first switch connected between node A and both input a1 of MIC 106 and input G1 of MIA 102, and a second switch connected between node B and both input a1 of MIC 106 and input G1 of MIA 102. Accordingly, delay element 104 outputs the amplified residue of the previous successive approximation cycle. The effect of using capacitors A1 and B1 in such an alternating manner may be referred to as "ping-ponging." In some embodiments, controller 111 may be configured to provide control signals SEL, T&H, AMPL, COMP, $\Phi_A$ and $\Phi_B$.

In various embodiments, some or all of the components of NS-SAR ADC 100 and other embodiments disclosed herein may be implemented on a single monolithic semiconductor integrated circuit, such as a single semiconductor substrate and/or a silicon substrate. NS-SAR ADC 100 may be fabricated using one of a variety of different semiconductor processes, such as a CMOS, FinFET, BiCMOS, SOI, or other type of semiconductor process.

Figure 1B:
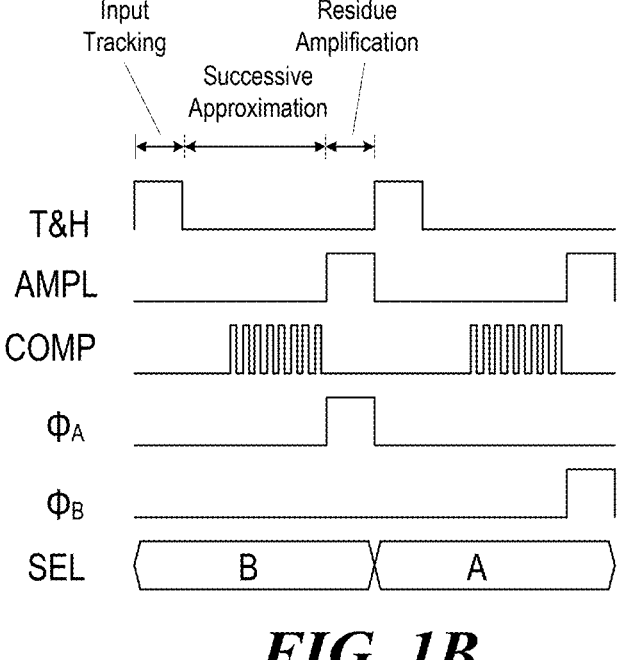
FIG. 1B illustrates a timing diagram of the NS-SAR ADC of FIG. 1A.

As shown in FIG. 1B, which illustrates a timing diagram of NS-SAR ADC 100, operation of NS-SAR ADC 100 proceeds in three phases: an input tracking phase, a successive approximation phase and a residue amplification phase. During the input tracking phase, when the track and hold signal T&H is high, input voltage $V_{in}$ is sampled using CDAC 110, for example, by sampling voltage $V_{in}$ on capacitors within CDAC 110.

Next, in the successive approximation phase, a successive approximation analog-to-digital conversion is performed on the sampled input voltage by successively approximating input voltage $V_{in}$ plus the previous amplified residue voltage by adjusting the input code $D_{CDAC}$ using MIC 106 and SAR 108. During this phase, MIC 106, SAR 108 and CDAC 110 work together to perform a successive approximation of the voltage sampled on capacitors within CDAC 110. For example, MIC 106 monitors the voltage $1*V_{CDAC}+a1*V_1$. Voltage $V_{CDAC}$ may be the voltage on the top plate of the capacitors of CDAC 110 and represents a difference between the sampled input voltage and a voltage corresponding to digital input code $D_{CDAC}$ of CDAC 110. During a number of cycles, MIC 106 compares the voltage $1*V_{CDAC}+a1*V_1$ with a reference voltage (not shown) and updates the contents of SAR 108 based on a comparison result. (In embodiments that utilize differential circuitry, such as the embodiment of FIG. 1D shown below, MIC 106 may take the difference between the positive and negative inputs instead of using a reference voltage.) As shown, MIC 106 is successively activated by toggling comparator signal COMP. In some embodiments, the successive approximation is performed using a binary search algorithm starting from the most significant bit (MSB) and concluding with the least significant bit (LSB) to determine a digital output code Dout. Alternatively, other search algorithms may be used instead of a binary search algorithm, such as a search algorithm having a radix less than two. During the conversion phase MIA 102 is deactivated.

At the beginning of the successive approximation phase, SAR 108 may be initialized with a specific value, typically the mid-range value (e.g., 100 . . . 0 for an N-bit converter). During each iteration of the successive approximation process, the control logic updates the value in SAR 108 based on the comparison generated by MIC 106. For example, if the input voltage is greater than a reference voltage, the most significant bit (MSB) in the register is set to 1; or if the input voltage is less than the reference voltage, the MSB in the register is set to 0. After updating the MSB, the SAR register shifts its contents one bit to the left, effectively moving the next bit position to the MSB position for the next iteration. The process of updating the MSB and shifting the register contents is repeated for each bit position, from the MSB to LSB. After all iterations are complete, the final value stored in the SAR register represents the digital output code that approximates the input analog voltage.

During the residue amplification phase, MIA 102 is activated by asserting amplifier activation signal AMPL, which amplifies a weighted sum of the remaining residue present on node $V_{CDAC}$ and a previous residue voltage stored on one of capacitors A1 or B1. Also, during this phase, the output of MIA 102 is respectively sampled on one of capacitors A1 or B1 of delay element 104 using select signals $\Phi_A$ and $\Phi_B$ via respective switches S1 and S2. In some embodiments, select signals $\Phi_A$ and $\Phi_B$ are alternately activated. For example, at the end of odd conversion cycles, select signal PA causes the output MIA 102 to be sampled on capacitor A1 at node A via switch S1, and at the end of even conversion cycles, select signal $\Phi_B$ causes the output of MIA 102 to be sampled on capacitor B1 via switch S2. Alternatively, at the end of odd conversion cycles, select signal PB may activate switch S2, and at the end of even conversion cycles, select signal PA may activate switch S1. At the beginning of the next successive approximation cycle, the most recently sampled one of capacitors A1 or B1 is connected to the a1 input of MIC 106 and G1 input of MIA 102 (for the next residue amplification phase) via switch S3 controlled by select signal SEL as shown on the timing diagram of FIG. 1B. As shown, during the first cycle select signal SEL causes capacitor B1 at node B to be connected to the a1 input of MIC 106 and the G1 input of MIA 102 via switch S3, and during the second cycle select signal SEL causes capacitor A1 at node A to be connected to the a1 input of MIC 106 and the G1 input of MIA 102 via switch S3.

Figure 1C:
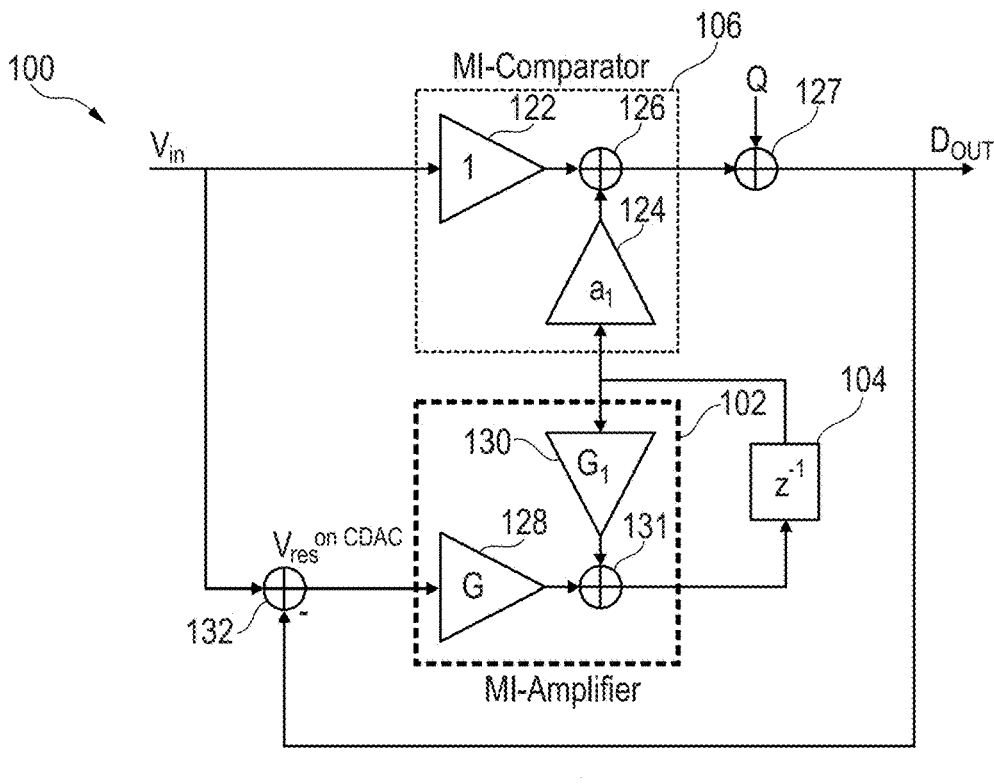
FIG. 1C illustrates a signal flow diagram of the NS-SAR ADC of FIG. 1A.
Figure 1D:
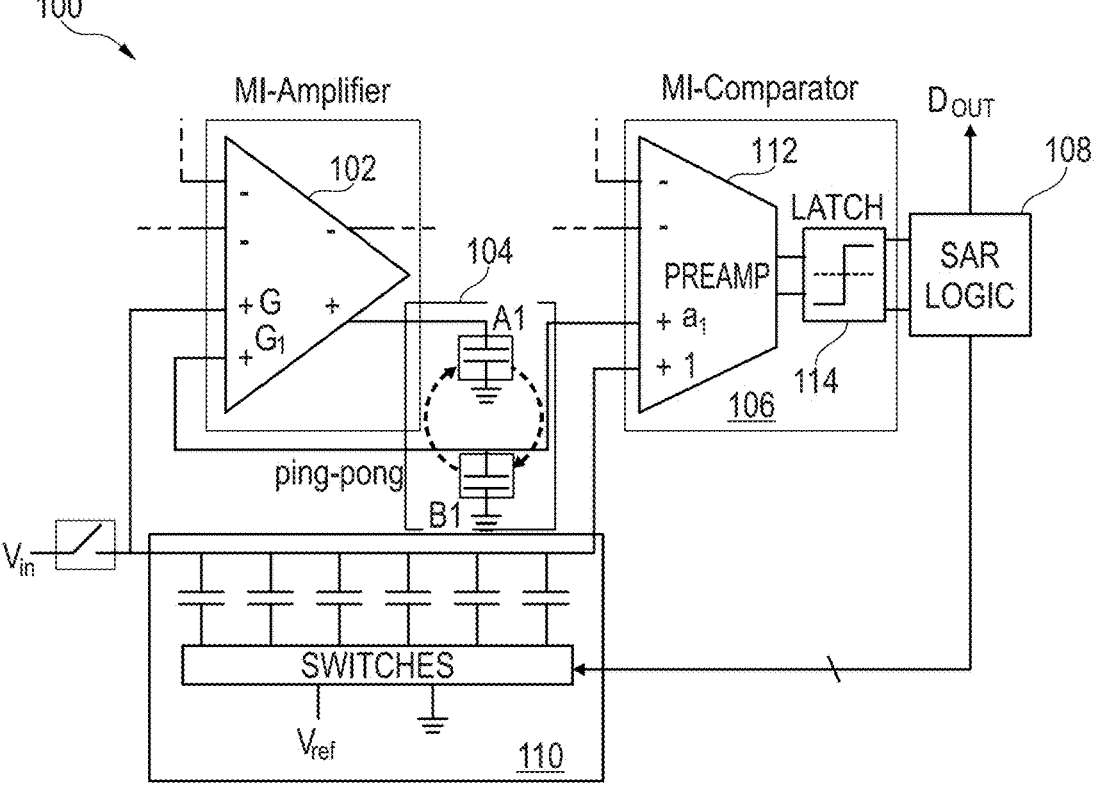
FIG. 1D illustrates a differential version of the NS-SAR ADC of FIG. 1A.

FIG. 1C illustrates a signal flow diagram of the noise shaping loop of NS-SAR ADC 100, which forms a first order error feedback (EF) structure. As shown, MIC 106 is represented by gain elements 122 and 124 that respectively provide gains of 1 and a1, and summer 126. The quantization noise contribution of the successive operation conversion is represented by quantization noise Q and summer 127. MIA 102 is represented by gain elements 128 and 130 that respectively provide gains of G and G₁, and summer 131. Unit delay element 104 is represented by delay element 104 having a single cycle delay; and CDAC 110 is modeled as a subtractor 132 that subtracts the final output Dour of the successive approximation from input voltage $V_{in}$ to form residue voltage $V_{res}$.

Based on the block diagram of FIG. 1C, it can be seen that MIA 102 receives both the SAR residue signal $V_{res}$ ($V_{in}$– $D_{OUT}$), and the output of MIA 102 in the previous conversion cycle. Accordingly, the noise shaping loop of FIG. 1C has an error feedback structure. Moreover, based on an analysis of the block diagram of FIG. 1C the following signal transfer function STF(z) and noise transfer function NTF(z) of the noise shaping loop can be derived:

$$STF(z) = \frac{D_{OUT}(z)}{v_{in}(z)} = 1; \tag{1}$$

$$NTF(z) = \frac{D_{OUT}(z)}{Q(z)} = \frac{1 - z^{-1}G_1}{1 - z^{-1}(G_1 - a_1G)}, \tag{2}$$

As is apparent from equation 2, NTF (z) has a zero positioned at G₁. In some embodiments, gain G₁ is set to be approximately 1, which places the zero close to the point (1,0) of the Gauss plane to increase or maximize the noise shaping effect. Alternatively, other gains may be used depending on the particular system and its specifications. Noise transfer function NTF (z) has a pole at G₁–a₁G. If the comparator and amplifier paths are matched (e.g., a₁=G₁/G), then the pole is located at the origin of the z-plane. If $$a_1 \neq \frac{G_1}{G},$$

(e.g., the pole is not located at the origin), then the pole can be used to enhance the shaping strength of the noise shaping loop.

While NS-SAR ADC 100 is shown implemented in a single-ended manner in FIG. 1A, it should be understood that NS-SAR ADC 100 could also be implemented as a differential structure, as shown in FIG. 1D, which shows a half circuit illustration of a differential version of NS-SAR ADC 100. As shown, MIA 102 and multi-input pre-amplifier 112 are implemented using fully differential amplifiers or pseudo differential amplifiers and include a first instance of CDAC 110 (also referred to as a first capacitor array DAC) and delay element 104 coupled to the positive phase inputs and outputs of MIA 102 and multi-input pre-amplifier 112 (also referred to as a differential pre-amplifier). In addition to what is shown, the differential version of NS-SAR ADC 100 further includes a second instance of CDAC 110 (also referred to as a second capacitor array DAC) and delay element 104 (not shown for simplicity of illustration)

coupled in a similar/symmetric manner to the negative phase inputs and outputs of MIA 102 and multi-input pre-amplifier 112.

As shown, capacitors A1 and B1 of delay element 104 are denoted with dashed line arrows labeled "ping-pong" which denote the "ping-pong" method of operation described above with respect to FIGS. 1A and 1B using sampling switches S1, S2 and S3 in which the respective couplings of capacitors A1 and B1 with respect to MIA 102 and MIC 106 change places every conversion cycle. This short hand annotation of sampling and changing the coupling of capacitors of delay element 104 is used in the remainder of the present disclosure for ease of illustration.

Figure 2A:
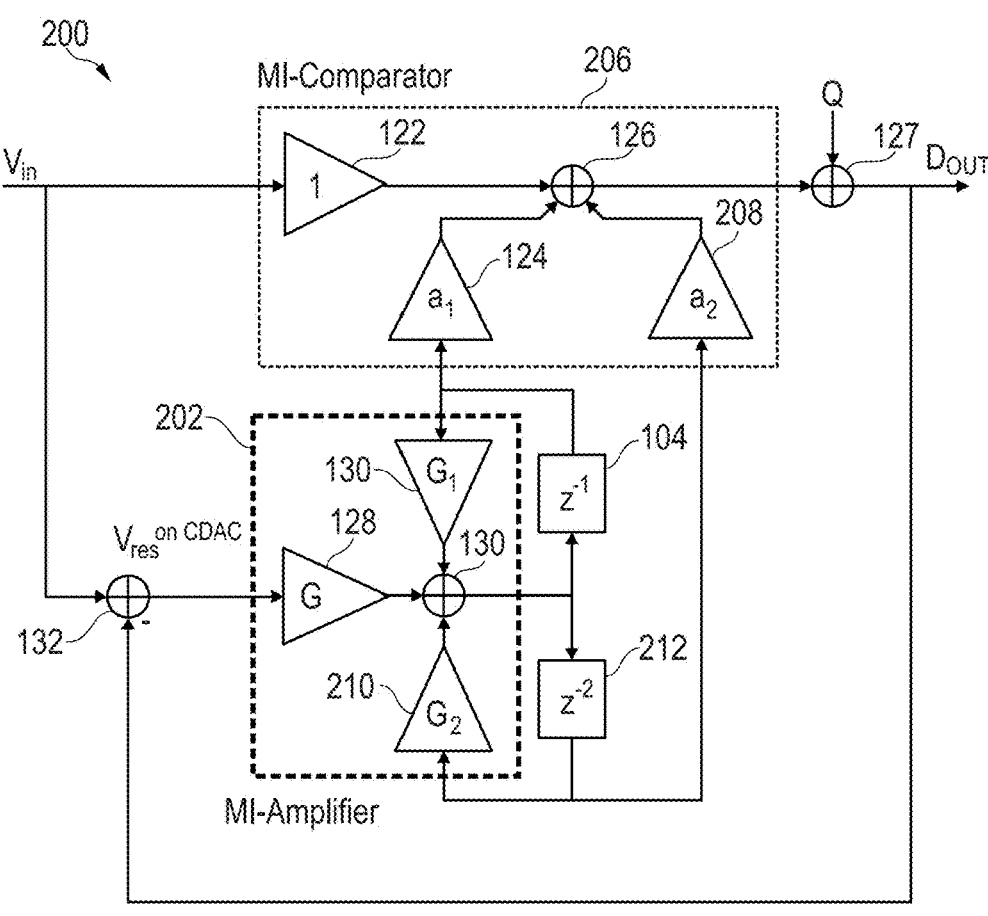
FIG. 2A illustrates a signal flow diagram of an embodiment NS-SAR ADC having a second order error feedback (EF) noise shaping loop.

While NS-SAR ADC 100 described above with respect to FIGS. 1A-1D is configured as a first-order noise shaping loop, embodiments of the present invention can also be directed to higher order noise shaping loops. For example, FIG. 2A illustrates a signal flow diagram of an embodiment NS-SAR ADC 200 having a second order EF noise shaping loop. The signal flow diagram of the second order noise shaping loop of FIG. 2A is similar to the signal flow diagram of the first order noise shaping loop of FIG. 1C, with the addition of an additional gain element 208 in MIC 206 having a gain of a₂, an additional gain element 210 in MIA having a gain of G₂, and an additional delay element 212 coupled between the output of MIA 202 and the input of gain element 210.

Figure 2B:
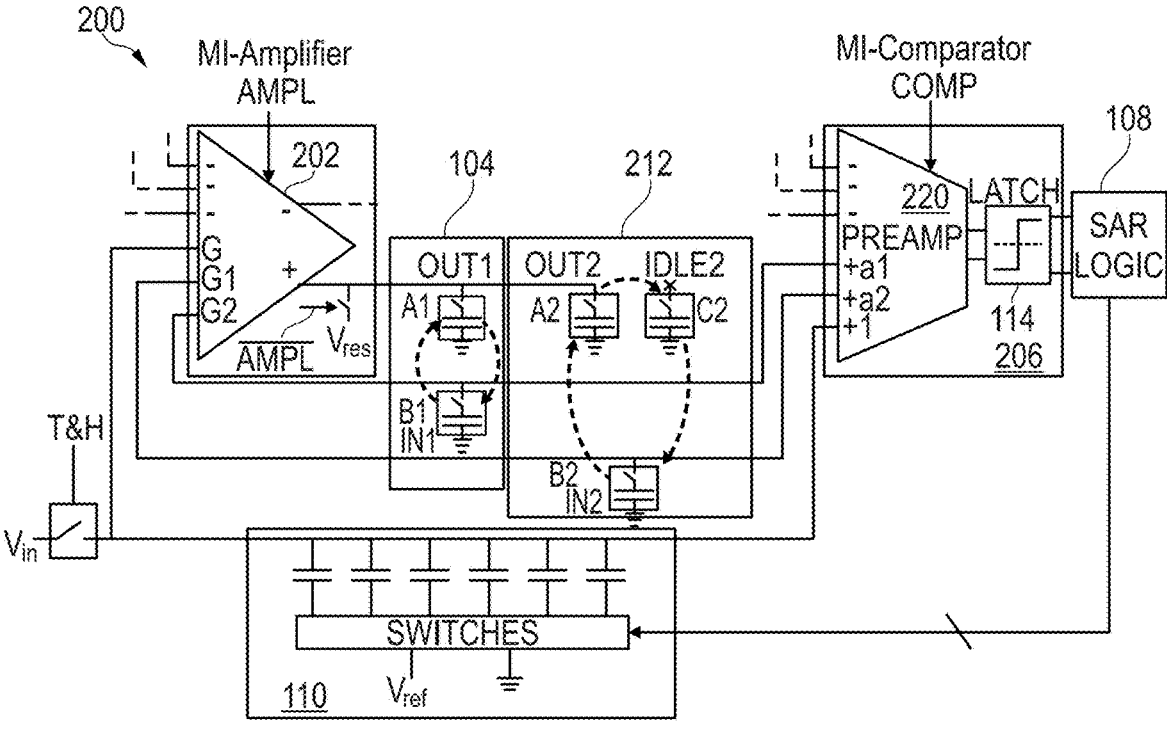
FIG. 2B illustrates a schematic depiction of the NS-SAR ADC of FIG. 2A.

FIG. 2B illustrates a schematic depiction of NS-SAR ADC 200, which is a differential circuit implementation of the signal flow diagram shown in FIG. 2A that implements second order noise shaping. It is evident from the illustration that NS-SAR ADC 200 bears a resemblance to the NS-SAR ADC depicted in FIG. 1D. However, a notable difference is in the MIA 202, which features three differential inputs with gain levels labeled as G, G1, and G2, diverging from the two differential inputs found in MIA 102. Moreover, MIC 206 has been expanded to include three differential inputs corresponding to gain values a1, a2, and 1, unlike its counterpart MIC 106 in FIG. 1D having two differential inputs.

Besides delay element 104, another delay element, designated as 212, is connected in the circuit between MIA 202 and MIC 206. This delay element 212 is composed of three capacitors, labeled A2, B2, and C2. They are configured in such a manner that they execute a two-cycle delay. Similar to FIG. 1D, the second instances of CDAC 110 and delay elements 104 and 212 coupled to the negative inputs of MIA 202, MIC 206 and SAR 108 are not shown in FIG. 2B for ease of illustration. It should be further understood the NS-SAR ADC 200 could also be implemented in a single-ended manner.

Figure 2C:
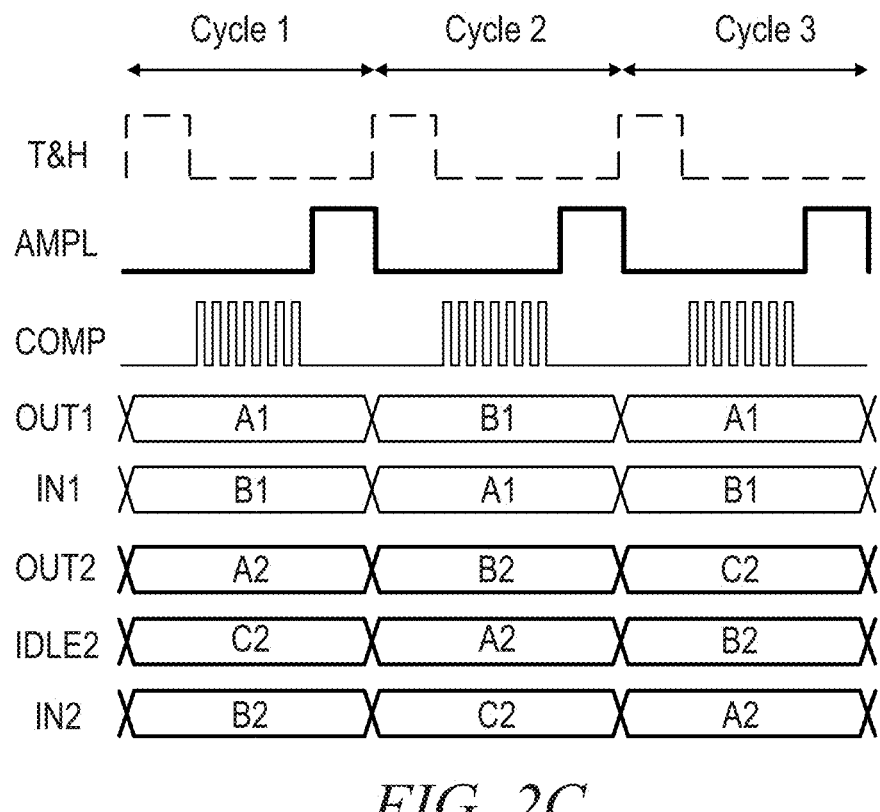
FIG. 2C is a timing diagram that illustrates the operation of the NS-SAR ADC of FIG. 2B.

FIG. 2C is a timing diagram that illustrates the operation of NS-SAR ADC 200. As shown, track and hold signal T&H, amplifier signal AMPL and comparator signal COMP operate in a similar manner as the embodiment of FIGS. 1A and 1B.

With respect to delay element 104, signal OUT1 indicates which of capacitors A1 and B1 of delay element 104 is connected to the output of MIA 202 in a particular conversion cycle, and signal IN1 indicates which of capacitors A1 and B1 is connected to input a1 of MIC 206 and input G1 of MIA 202 during the cycle. Accordingly signals OUT1 and IN1 indicate that capacitor A1 is connected to the output of MIA 202 (to be sampled) and capacitor B1 is connected to the input of MIC 206 and input G1 of MIA 202 during cycle 1, and capacitor B1 is connected to the output of MIA 202

(to be sampled) and capacitor A1 is connected to the input of MIC 206 and input G1 of MIA 202 during cycle 2 in an alternating manner.

With respect to delay element 212, signal OUT2 indicates which of capacitors A2, B2 and C2 of delay element 212 is connected to the output of MIA 202 in a particular conversion cycle, signal IN2 indicates which of these capacitors is connected to input a2 of MIC 206 and input G2 of MIA 202 during the cycle, and signal IDLE2 indicates which of these capacitors is "idle" during the cycle. In various embodiments, an "idle" capacitor is disconnected from the MIA 202 and the input of MIC 206 via sampling switches. Accordingly signals OUT2, IDLE2 and IN2 indicate that capacitor A2 is connected to the output of MIA 202 (to be sampled), capacitor C2 is idle, and capacitor B2 is connected to the a2 input of MIC 206 and input G2 of MIA 202 during cycle 1; capacitor B2 is connected to the output of MIA 202 (to be sampled), capacitor A2 is idle, and capacitor C2 is connected to the a2 input of MIC 206 and input G2 of MIA 202 during cycle 2; and capacitor C2 is connected to the output of MIA 202 (to be sampled), capacitor B2 is idle, and capacitor A2 is connected to the a2 input of MIC 206 and input G2 of MIA 202 during cycle 3. As can been seen, there is a two-cycle delay from a cycle in which a particular capacitor A2, B2 and C2 is sampled at the output of MIA 202 to the cycle in which the particular capacitor A1, B2 and C2 is coupled to the input of MIC 206 and input G2 of MIA 202.

Figure 2D:
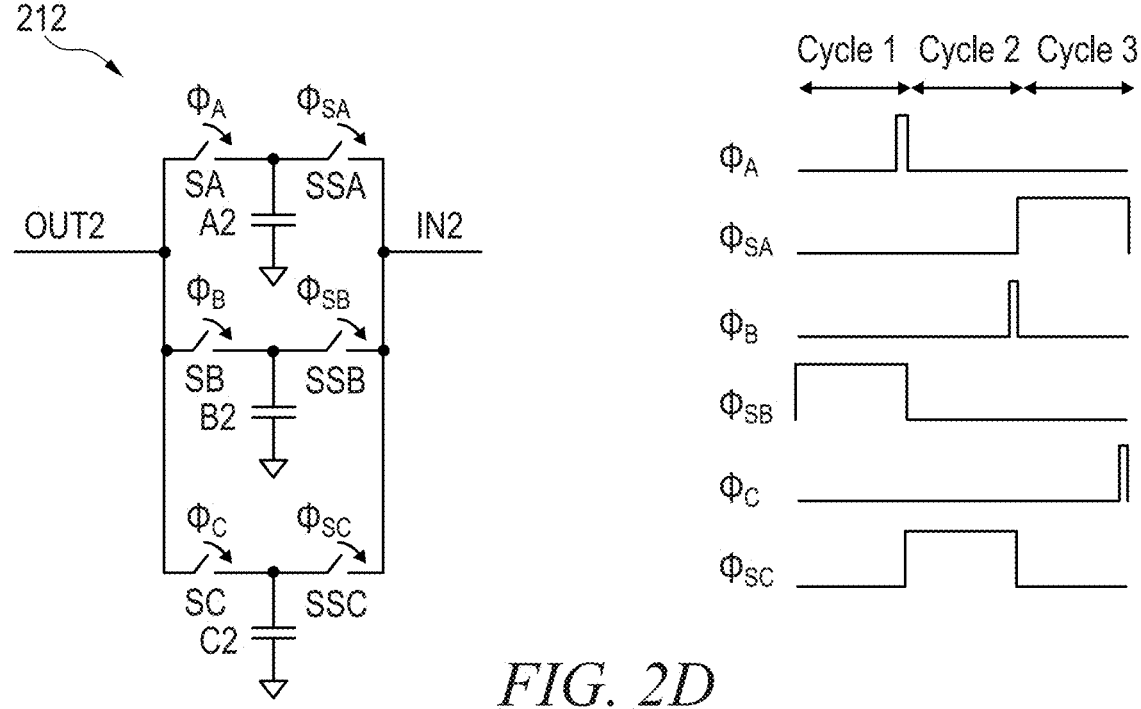
FIG. 2D illustrates a schematic of a delay element and an accompanying timing diagram that can be used to implement delay elements according to an embodiment.

FIG. 2D illustrates a schematic of delay element 212 and an accompanying timing diagram according to an embodiment. As shown, delay element includes capacitors A2, B2 and C2 that are respectively connected to node OUT2 (corresponding to the output of MIA 202) via switches SA, SB and SC and respectively connected to node IN2 (corresponding to the "a2" input of MIC 206 and to input G2 of MIA 202) via switches SSA, SSB and SSC. Switches SA, SB and SC are respectively controlled by control signals $\Phi_A$, $\Phi_B$, and $\Phi_C$, and switches SSA, SSB and SSC are respectively controlled by control signals $\Phi_{SA}$, $\Phi_{SB}$, and $\Phi_{SC}$.

The right-hand portion of the figure presents the timing diagram of delay element 212, showing the relationship between control signals $\Phi_A$, $\Phi_B$, and $\Phi_C$, and control signals PSA, $\Phi_{SB}$, and $\Phi_{SC}$. During cycle 1, control signal $\Phi_A$ is pulsed high near the end of the conversion cycle (e.g., during the residue extraction phase after the successive approximation conversion has been performed) to sample the output of MIA 202 on capacitor A2 while control signal $\Phi_{SB}$ is active during the entire cycle to couple capacitor B2 to the "a2" input of MIC 206. During cycle 2, control signal $\Phi_B$ is pulsed high near the end of the conversion cycle to sample the output of MIA 202 on capacitor B2 while control signal $\Phi_{SC}$ is active during the entire cycle to couple capacitor C2 to the "a2" input of MIC 206; and during cycle 3, control signal Pc is pulsed high near the end of the conversion cycle to sample the output of MIA 202 on capacitor C2 while control signal $\Phi_{SA}$ is active during the entire cycle to couple capacitor A2 to the "a2" input of MIC 206.

In various embodiments, switches SA, SB, SC, SSA, SSB, SSC (as well as switches S1, S2, S3 and the switches within CDAC 110 and other switches discussed in other embodiments herein) can be implemented, for example, using switching transistors, such as NMOS or PMOS transistors. In alternative embodiments, other transistor types or device types could be used. It should be understood that the implementation of delay element 212 illustrated in FIG. 2D and its corresponding timing diagram is just one of a number of different ways that delay element 212 could be physically implemented.

Figure 3A:
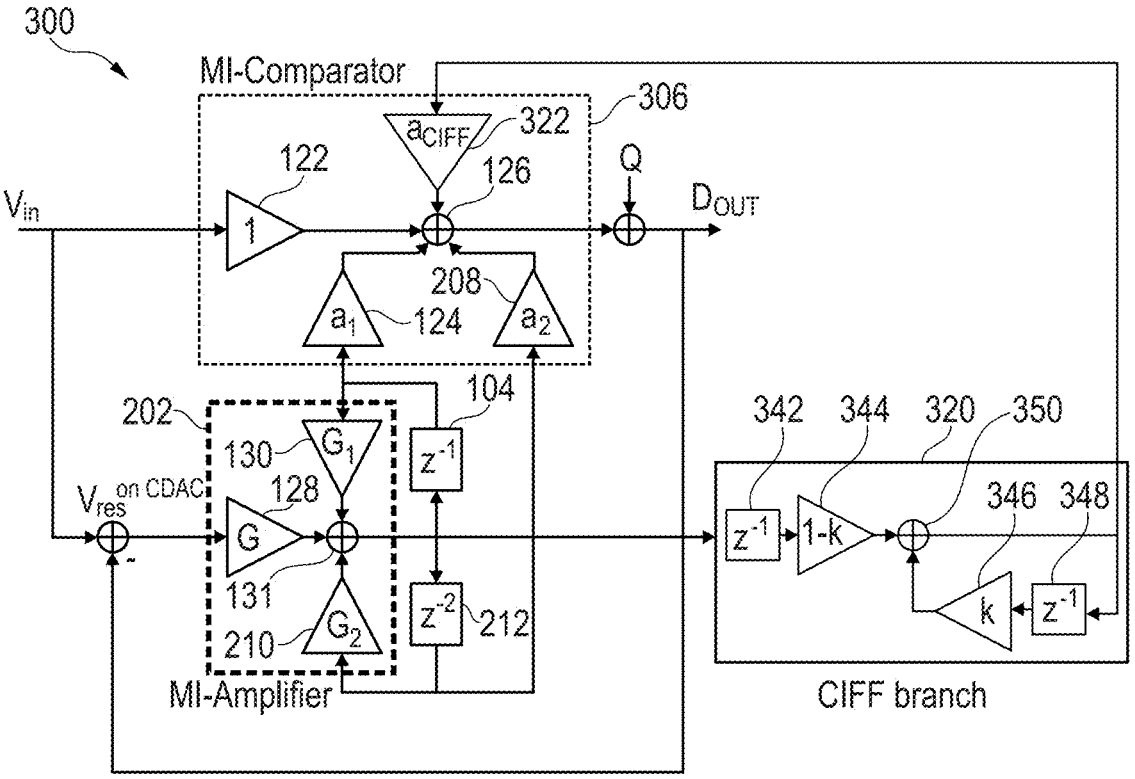
FIG. 3A illustrates a signal flow diagram of an embodiment NS-SAR ADC that includes a cascaded integrator feed-forward (CIFF) path.

FIG. 3A illustrates a signal flow diagram of an embodiment NS-SAR ADC 300 that includes the second order EF noise shaping loop of NS-SAR ADC 200 described above with respect to FIGS. 2A-2D with the addition of a cascaded integrator feed-forward (CIFF) path 320 that provides further noise shaping control of NS-SAR ADC 200. As shown, CIFF path 320 is coupled between the output of MIA 202 at summing node 131 and an additional input $a_{CIFF}$ of MIC 306. CIFF branch 320 includes a simple IIR filter that includes a forward path of a unit delay element 342 coupled in series with gain element 344 having a gain of 1-k, a feedback path having unit delay element 348 in series with gain element 346 having a gain of k, and a summer 350 that couples the output of the feedback path to the forward path. It should be understood, however, that the depicted topology of CIFF branch 320 is just one of many different types of CIFF structures that could be used in conjunction with embodiment NS-SAR ADCs. In alternative embodiments, other CIFF structures could be used including, but not limited to higher order filter structures. It should also be understood that CIFF signal paths could also be applied to other NS-SAR ADC embodiments disclosed herein. For example, a CIFF branch, such as CIFF branch 320 could be coupled between the output of MIA 102 and an additional input of MIC 106 of NS-SAR ADC 100 in the embodiment of FIGS. 1A-1D.

Figure 3B:
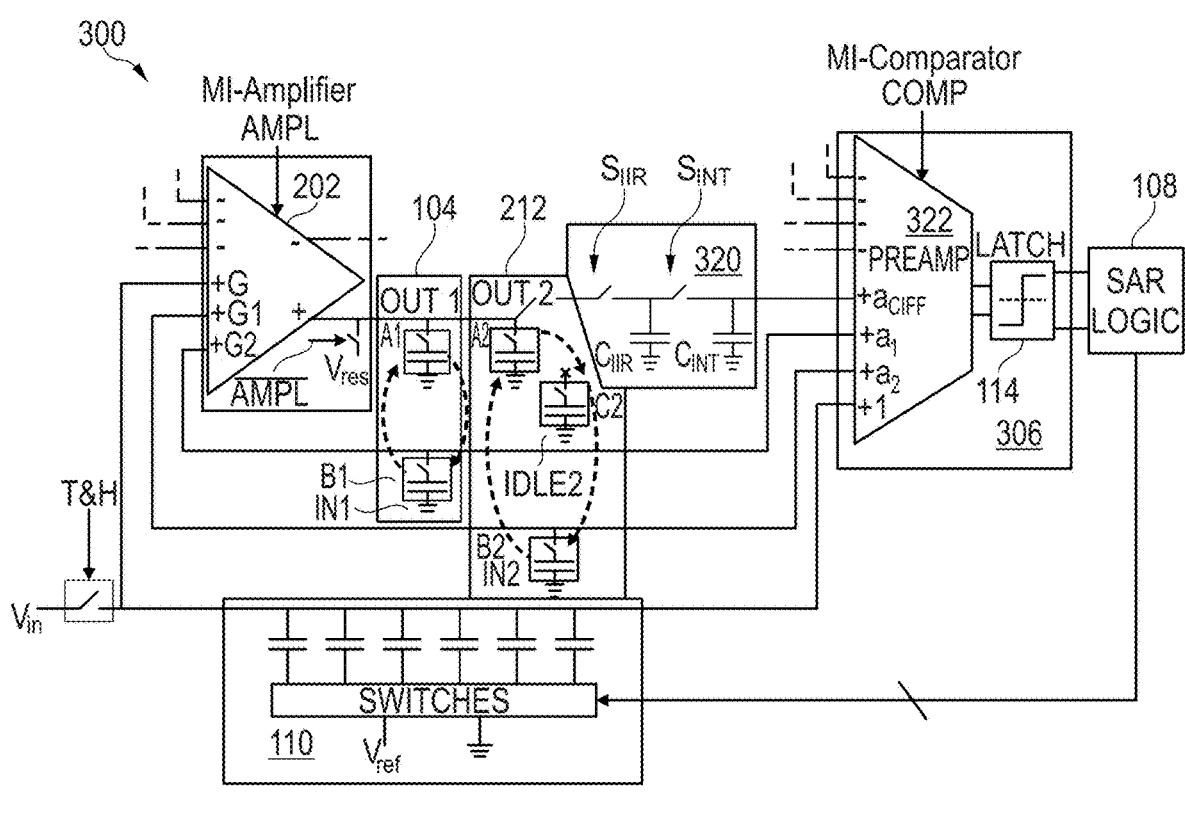
FIG. 3B illustrates a schematic depiction of the NS-SAR ADC of FIG. 3A.

FIG. 3B illustrates a schematic depiction of NS-SAR ADC 300, which is a differential circuit implementation of the signal flow diagram shown in FIG. 3A that includes CIFF branch 320 (also referred to as a filter circuit). NS-SAR ADC 300 is similar to NS-SAR ADC 200 depicted in FIG. 2B; however, MIC 306 in this version has been expanded to include four differential inputs corresponding to gain values $a_{CIFF}$, a1, a2, and 1, unlike MIC 206 in FIG. 2A having three differential inputs. As shown, NS-SAR 300 includes the addition of CIFF path 320 coupled between the output of MIA 202 and the $a_{CIFF}$ input of MIC 306. CIFF path 320 includes a cascaded delay path that includes capacitor $C_{IIR}$ coupled to the output of MIA 202 via a switch controlled by signal $S_{IIR}$, and capacitor $C_{INT}$ coupled to capacitor CIR via a switch controlled by signal $S_{INT}$ and to the $a_{CIFF}$ input of MIC 306. In alternative embodiments, CIFF 320 could be implemented in a different manner. Similar to FIGS. 1D and 2B, second instances of CDAC 110, CIFF path 320, delay elements 104 and 212 coupled to the negative inputs of MIA 202, MIC 206 and SAR 108, are not shown in FIG. 3B for ease of illustration. It should be further understood that NS-SAR ADC 300 could also be implemented in a single-ended manner.

Figure 3C:
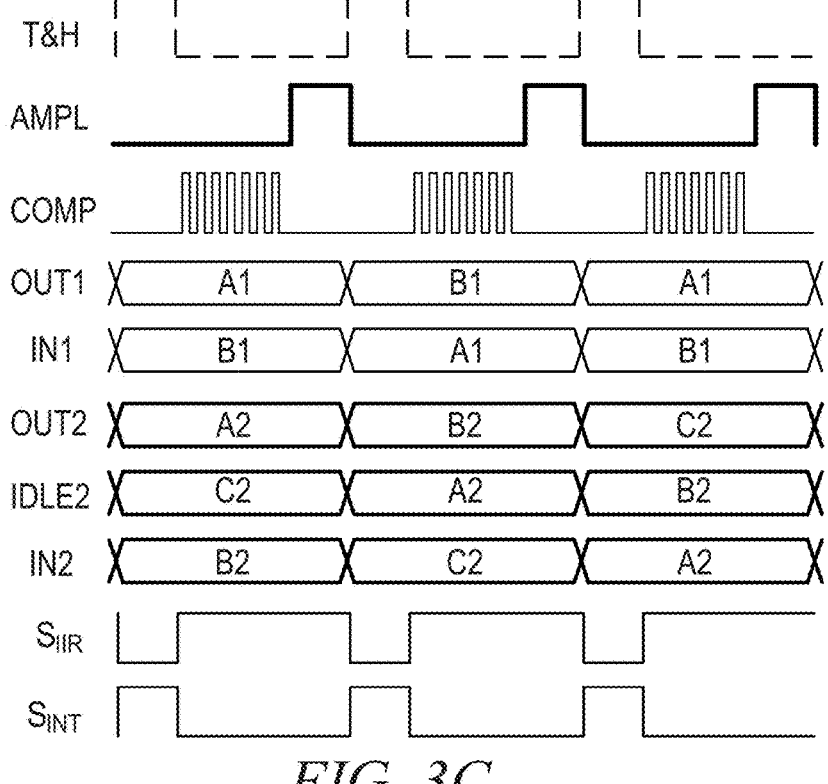
FIG. 3C is a timing diagram that illustrates the operation of the NS-SAR ADC of FIG. 3B.

FIG. 3C is a timing diagram that illustrates the operation of NS-SAR ADC 300. As shown, track and hold signal T&H, amplifier signal AMPL, comparator signal COMP, and signals OUT1, IN1, OUT2, IDLE2, and IN2 operate in a similar manner as the embodiment of FIGS. 2A-2C. With respect to CIFF path 320, signal $S_{IIR}$ is de-asserted and signal $S_{INT}$ is asserted during the track-and-hold phase of each conversion cycle. This essentially performs the function of a passive integrator by decoupling capacitor $C_{IIR}$ from the output of MIA 202 and transferring the charge from capacitor $C_{IIR}$ to $C_{INT}$. During the remainder of each cycle, signal $S_{IIR}$ is asserted and signal $S_{INT}$ is de-asserted, which couples the capacitor $C_{IIR}$ to the output of MIA 202 and disconnects capacitor $C_{IIR}$ from capacitor $C_{INT}$. In this embodiment, since capacitor $C_{IIR}$ is reset for the next residue amplification cycle, it is also connected to the output of MIA 202 during the conversion phase instead of only during the residue amplification phase. In this way, capacitor $C_{IIR}$ is reset during the conversion phase since the output of MIA 202 is also reset during this phase, without requiring any additional switches. In alternative embodiments, one or more additional switches may be used to couple $C_{IIR}$ to the output of MIA 202 only during the residue extraction phase.

In various embodiments, the order of the noise shaping loop may be increased, for example by adding additional delay elements coupled having an inputs coupled to the output of the multi-input amplifier (MIA), and outputs coupled to the input of the multi-input comparator (MIC) and outputs coupled to a further input of the MIA. For example, the embodiment of FIGS. 2A-2D could be extended to a third-order noise shaping loop by adding an additional delay element that implements a three-cycle delay. Such a circuit would include four capacitors, each of which would sample the output of MIA 202 on a particular cycle, kept idle for two cycles, and then coupled to the input of the MIC and a fourth input of the MIA during a fourth cycle. In general, each additional delay element that implements an n-cycle delay would include n+1 capacitors that are each sampled on a particular cycle, kept idle for n−1 cycles, and then connected to the n+1$^{th}$ input of the MIC and to MIA 202 for the n$^{th}$ cycle. However, as the filter order increases, higher gain in the MIA might be needed to implement some noise transfer functions. This gain may be difficult to achieve with some amplifier topologies.

Figure 4A:
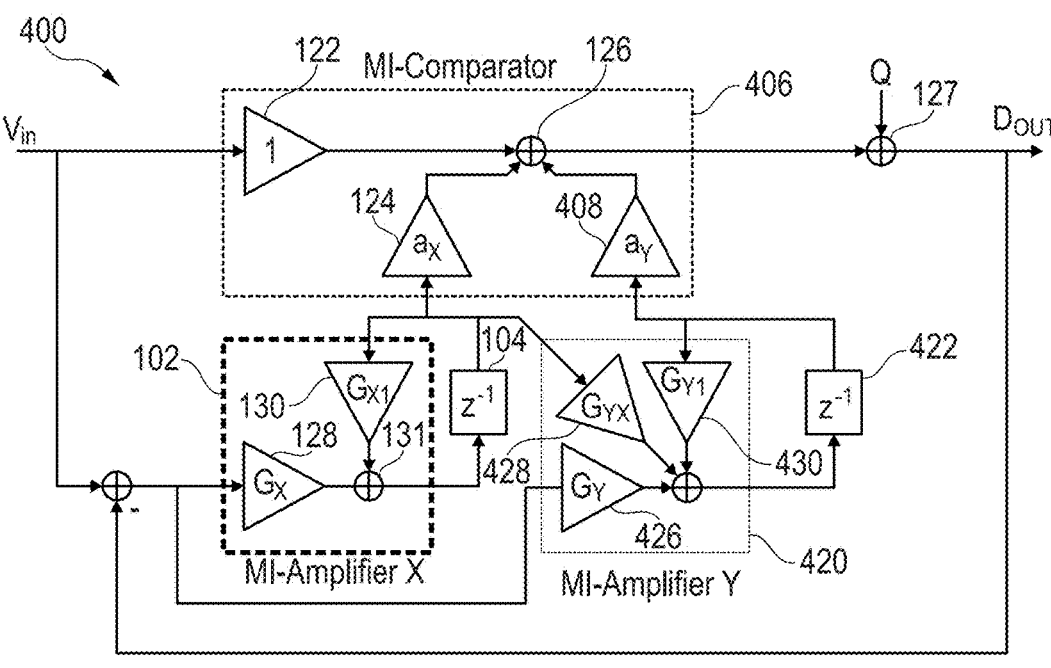
FIG. 4A illustrates a signal flow diagram of an embodiment NS-SAR ADC that includes a second-order cascaded multi-input EF architecture.

FIG. 4A illustrates a signal flow diagram of an embodiment NS-SAR ADC 400 that includes a cascaded multi-input EF architecture. By using a cascaded architecture, higher order loop filters can be achieved with amplifier gains similar to those of a first order loop. In the embodiment of FIG. 4A, NS-SAR ADC 400 implements a second order loop by cascading two first order sections: the first first-order section includes MIA 102 and delay element 104 as described in embodiments above, and the second first-order section includes a further MIA 420 and further delay element 422. As shown, MIA 102 includes gain elements 128 and 130 with respective gains designated as $G_X$ and $G_{X1}$, and the MIA 420 includes three-gain elements with respective gains designated as $G_Y$, $G_{YX}$ and $G_{Y1}$. The input of gain element 426 is coupled to the input of MIA 102, the input of gain element 428 is coupled to the output of delay element 104, and the input of gain element 430 is connected to the output of delay element 422. MIC 406 includes three gain elements 122, 124 and 408 having corresponding gains of 1, $a_X$ and $a_Y$ that are respectively coupled to $V_{in}$, the output of delay element 104 and the output of delay element 422.

In further embodiments, the signal flow diagram of FIG. 4A can be extended to include M first order stages, where the M$^{th}$ stage includes an associated delay element and an MIA with M+1 gain elements that are each respectively coupled to the input of MIA 102 and to the outputs of the delay element associated with each previous first order stage. For such embodiments, the MIC would have at least M+1 inputs that are respectively coupled to $V_{in}$ and to the outputs of the associated delay element of each stage. The gains of each gain element may be adjusted to achieve a desired noise transfer function.

Figure 4B:
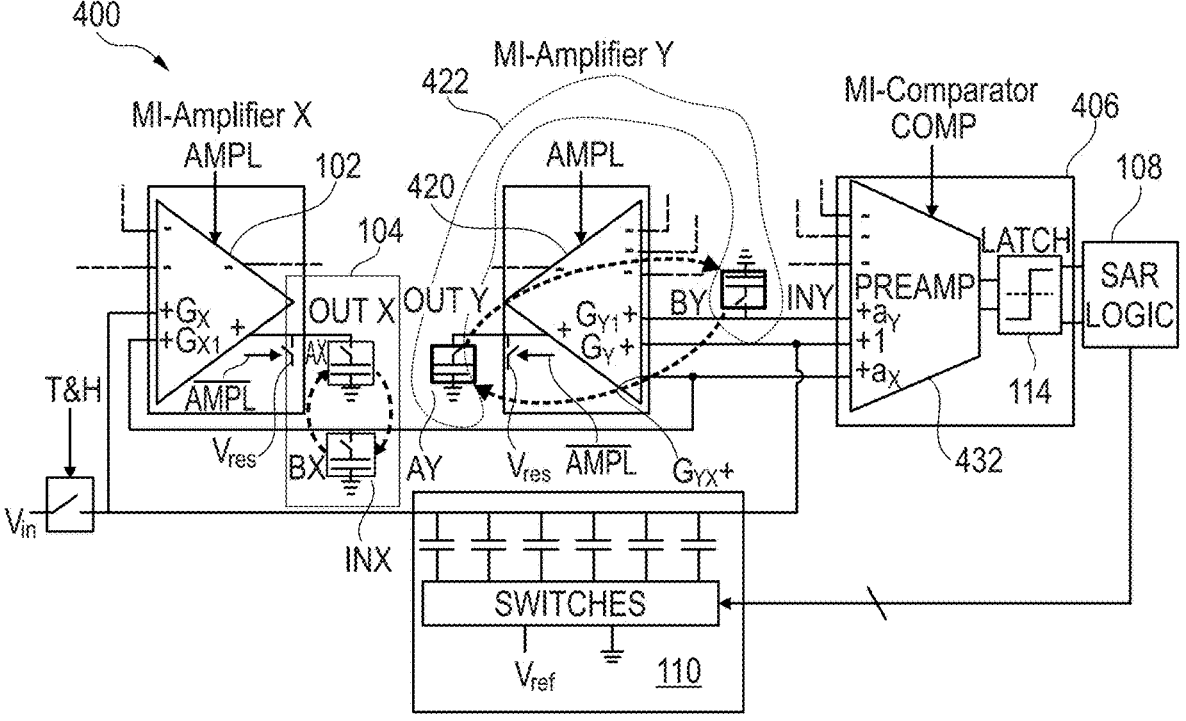
FIG. 4B illustrates a schematic depiction of the NS-SAR ADC of FIG. 4A.

FIG. 4B illustrates a schematic depiction of NS-SAR ADC 400, which is a differential circuit implementation of the signal flow diagram shown in FIG. 4A. NS-SAR ADC 400 is similar to NS-SAR ADC 100 depicted in FIG. 1D with the addition of an additional MIA 420 and additional delay element 422. Delay element 422 includes capacitors AY and BY and operates in a similar manner as delay element 104, e.g., by "ping-ponging" the connectivity of each capacitor. As shown, MIC 406 includes multi-input pre-amplifier 432 having inputs with relative gains of $a_Y$, 1 and $a_X$. Similar to FIGS. 1D, 2B and 3B second instances of CDAC 110, delay elements 104 and 422 coupled to the negative inputs of MIAs 102 and 420, MIC 406 and SAR 108, are not shown in FIG. 4B for ease of illustration. It should be further understood that NS-SAR ADC 400 could also be implemented in a single-ended manner.

Figure 4C:
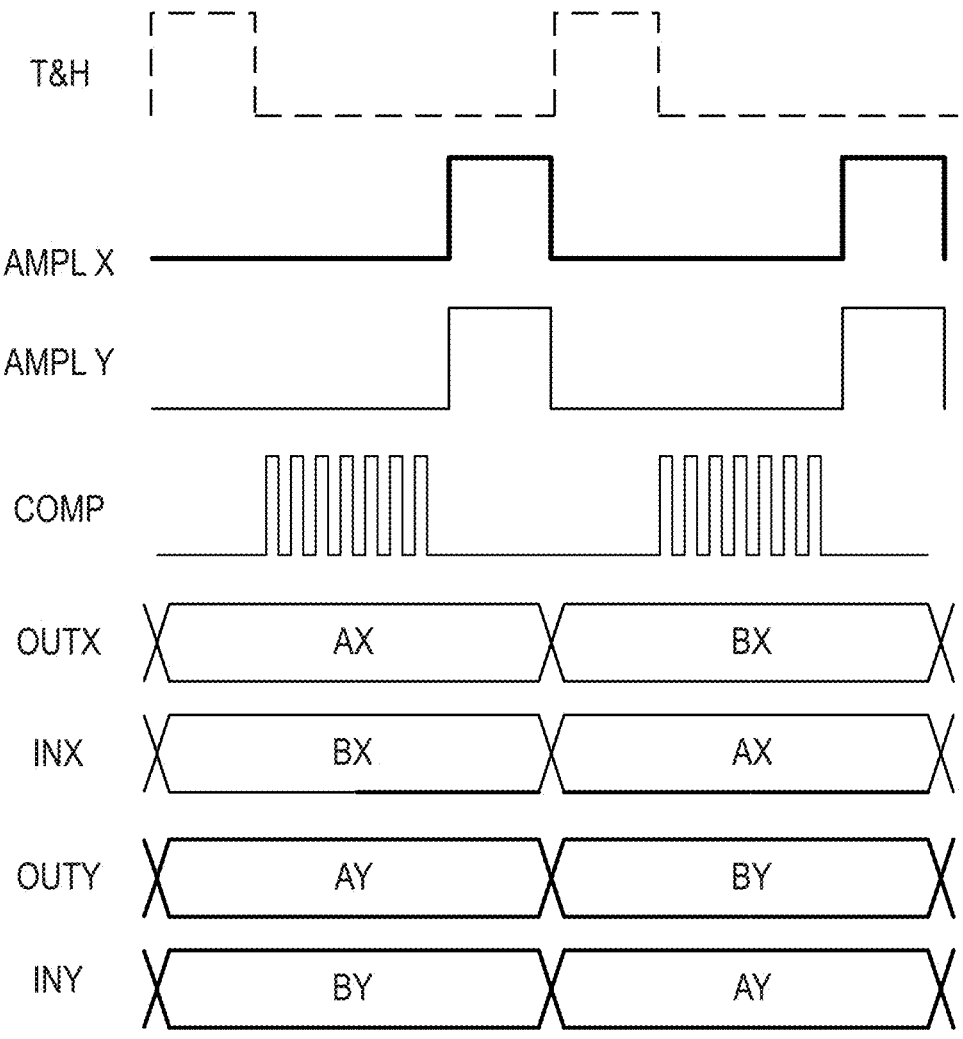
FIG. 4C is a timing diagram that illustrates the operation of the NS-SAR ADC of FIG. 4B.

FIG. 4C is a timing diagram that illustrates the operation of NS-SAR ADC 400. As shown, track and hold signal T&H, amplifier signals AMPL X and AMPL Y, and comparator signal COMP operate in a similar manner as the embodiment of FIGS. 1A and 1B. Signal OUTX indicates which of capacitors AX and BX are connected to the output of MIA 102, and signal INX indicates which of capacitors AX and BX are connected to the input $a_X$ of MIC 406, the input $G_{X1}$ of MIA 102 and the input $G_{YX}$ of MIA 420. Similarly, signal OUTY indicates which of capacitors AY and BY are connected to the output of MIA 420, and signal INY indicates with of capacitors AY and BY are connected to the $a_y$ input of MIA 420 an to input GY1 of MIA 420.

In alternative embodiments, the order of the noise shaping loop can be extended by adding additional MIAs and delay elements as discussed above with respect to FIG. 4A.

Figure 5A:
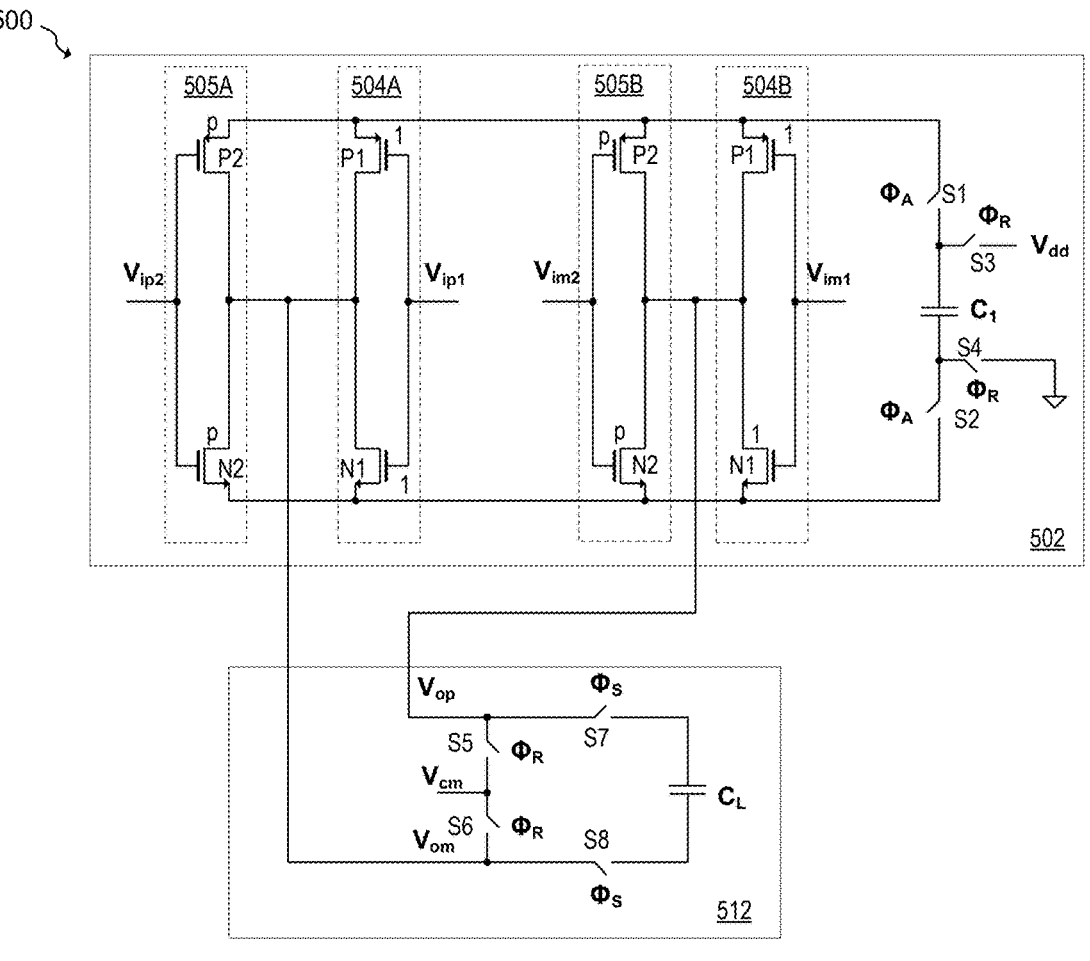
FIG. 5A illustrates a schematic of a floating inverter dynamic amplifier (FIDA) that can be used to implement amplifiers according to some embodiments.

In various embodiments, MIAs 102, 202 and 420, and/or multi-input pre-amplifiers 112, 220, 322 and 432 may be implemented using a floating inverter dynamic amplifier (FIDA) 500 as illustrated in FIG. 5A. As shown, FIDA 500 includes FIDA core 502 and load circuit 512. Amplifier core 502 includes inverters 504A, 505A, 504B and 505B coupled to reservoir capacitor C1 via a switching network that includes switches S1, S2, S3 and S4. Load circuit 512 includes load capacitor $C_L$ coupled to the outputs of inverters 504A, 504B, 505A and 505B via a switching network that includes switches S5, S6, S7, and S8. Each inverter includes a PMOS transistor P1 and NMOS transistor N1. Reset switching signal $\Phi_R$ is used to control switches S3, S4, S5 and S6, amplification switching signal $\Phi_A$ is used to control switches S1 and S2, and sampling switching signal $\Phi_S$ is used to control switches S7 and S8.

In an embodiment, inverters 504A and 504B form a first differential input port with respect to signals $V_{ipt}$ and $V_{im1}$, and inverters 505A and 505B form a second differential input port with respect to signals $V_{ip2}$ and $V_{im2}$. The relative gain of each input port can be adjusted by adjusting the aspect ratios of inverters 504A, 504B, 505A and 505B. As shown, the transistors P1 and N1 of inverters 504A and 504B have a relative aspect ratio of 1, while transistors P2 and N2 of inverters 505A and 505B have a relative aspect ratio of p. Thus, the gain applied to signals $V_{ip2}$ and $V_{im2}$ is p times the gain applied to signals $V_{ip1}$ and $V_{im1}$. The absolute gain of each differential input can be adjusted by sizing transistors N1, N2, P1 and P2, as well as the size of the load capacitor $C_L$ using design techniques known in the art. While FIDA 500 is depicted as having two differential inputs, it should be understood that the number of differential inputs can be increased by adding additional pairs of inverters.

Figure 5B:
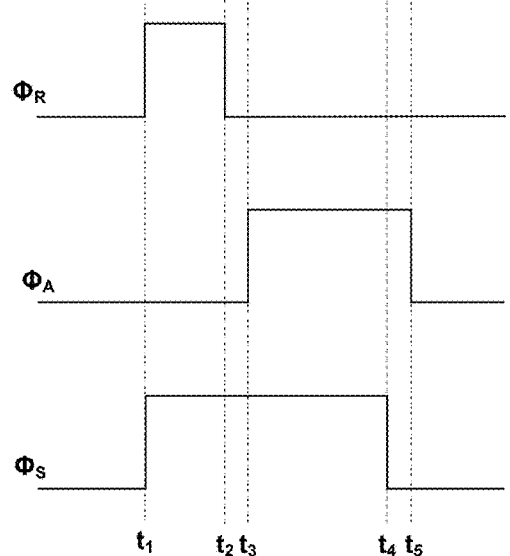
FIG. 5B is a timing diagram that illustrates the operation of the FIDA of FIG. 5A.

FIG. 5B illustrates a timing diagram that illustrates the operation of FIDA 500. During a first phase of operation, reset switching signal $\Phi_R$ and sampling switching signal $\Phi_S$ are asserted when amplification switching signal $\Phi_A$ is not asserted. During this phase of operation, reservoir capacitor C1 is coupled between power supply node $V_{dd}$ and ground via switches S3 and S2 respectively. Inverters 504A, 504B, 505A and 505B are disconnected from reservoir capacitor C1 and common mode voltage $V_{cm}$ is applied to the outputs of inverters 504A, 504B, 505A and 505B via switches S5 and S6 and to load capacitor $C_L$. At time $t_2$ reset switching signal $\Phi_R$ is de-asserted, which disconnects reservoir capacitor C1 from power supply node $V_{dd}$ and ground, and disconnects the common mode voltage node $V_{cm}$ from the outputs of inverters 504A, 504B, 505A and 505B and load capacitor $C_L$.

A second phase of operation begins at time $t_3$ when amplification switching signal $\Phi_A$ is asserted. In this second phase of operation, reservoir capacitor C1 is applied to the power supply nodes of inverters 504A, 504B, 505A and 505B, which allows current to flow in inverters 504A, 504B, 505A and 505B, thereby allowing inverters 504A, 504B, 505A and 505B to amplify input signals $V_{ip1}$, $V_{ip2}$, $V_{im1}$ and $V_{im2}$ and to produce amplified output signals $V_{om}$ and $V_{op}$. During this phase of operation, as reservoir capacitor C1 is discharged, the current through transistors P1, P2, N1 and N2 of inverters 504A, 504B, 505A and 505B steadily decreases. In some cases, transistors P1, P2, N1 and N2 start out in moderate inversion and end up in weak inversion.

At time $t_4$, sampling switching signal $\Phi_S$ is de-asserted, which disconnects load capacitor $C_L$ from inverters 504A, 504B, 505A and 505B by opening switches S7 and S8, thereby sampling output voltages $V_{op}$ and $V_{om}$ on load capacitor $C_L$. This period of time may be referred to as a sampling phase or a readout phase. At time $t_5$, amplification switching signal $\Phi_A$ is de-asserted and a next cycle operation may occur again starting at time $t_1$.

FIDA 500 is current efficient in that it does not require any static bias current. Its structure allows for PMOS transistors P1 and P2 and NMOS transistors N1 and N2 to contribute to amplification and provides for intrinsic common mode feedback because no common mode current flows to the output.

It should be understood that FIDA 500 is just one example of many possible amplifier topologies that could be used to implement embodiment MIAs and multi-input pre-amplifiers. In alternative embodiments, other FIDA topologies and/or other amplifier topologies could be used.

FIG. 6 illustrates a flowchart of an embodiment method 600 of performing an analog-to-digital conversion using, for example, an NS-SAR ADC described with respect to embodiments described above. In step 602, a first sampling circuit is used to sample an amplified previous residue value on a first capacitor at even conversion cycles, and in step 604, the amplified previous residue value is sampled on the second capacitor at odd conversion cycles. The sampling circuit may be implemented for example, using delay element 104 described above with respect to FIGS. 1A and 2B.

In step 606 an input voltage is sampled on a capacitor array digital-to-analog converter (CDAC), such as CDAC 110 described in embodiments above. Next, in step 608, a successive approximation analog-to-digital conversion on the sampled input voltage is performed. This conversion may include, using a multi-input comparator, iteratively comparing a summed voltage with a threshold, and adjusting an input code of the CDAC based on the comparing, where the summed voltage is a sum of an output of the CDAC and the sampled amplified previous residue value sampled by the first sampling circuit. The multi-input comparator may be implemented, for example, using MIC 106, 206, 306 and/or 406 described in embodiments above.

In step 610, after performing the successive approximation analog-to-digital conversion, a weighted sum of a present residue value at the output of the CDAC and a previous residue signal is amplified using a multi-input amplifier. The previous residue signal comprises a sampled amplified previous residue value sampled by the first sampling circuit. The multi-input amplifier may be implemented, for example using MIA 102, 202 and/or 420 described with respect to embodiments above. In various embodiments, the analog-to-digital conversion is repeatedly performed such that the weighted sum becomes the amplified previous residue value in an immediately subsequent analog-to-digital conversion.

In various embodiments, delay element 104 illustrated in FIGS. 1A, 1D, 2B, 3B and 4B may be referred to as a first sampling circuit, and capacitors A1 and B1 (or AX and BX) may be respectively referred to as a first capacitor and a second capacitor. In such embodiments, an analog-to-digital conversion is performed using the first sampling circuit to sample an amplified previous residue value on the first capacitor at even conversion cycles, sampling the amplified previous residue value on the second capacitor at odd conversion cycles, and sampling an input voltage on CDAC 110. A successive approximation analog-to-digital conversion is then performed on the sampled input voltage by: using MIC 106, iteratively comparing a summed voltage with a threshold, and adjusting an input code of the CDAC 110 based on the comparing, where the summed voltage comprises a sum of an output of CDAC 110 and the sampled amplified previous residue value sampled by the first sampling circuit. After performing the successive approximation analog-to-digital conversion, a weighted sum of a present residue value at the output of CDAC 110 and a previous residue signal is amplified using MIA 102. The previous residue signal includes a sampled amplified previous residue value sampled by the first sampling circuit. The analog-to-digital conversion may be repeated, such that the weighted sum becomes the amplified previous residue value in an immediately subsequent analog-to-digital conversion.

In some embodiments, delay element 212 illustrated in FIGS. 2B and 3B may be referred to as a second sampling circuit and capacitors A2, B2 and C2 may be respectively referred to as a third capacitor, a fourth capacitor and a fifth capacitor. Accordingly, performing an analog-to-digital conversion according to an embodiment includes sampling the amplified previous residue value on the third capacitor at a first conversion cycle of every three conversion cycles, sampling the amplified previous residue value on the fourth capacitor at a second conversion cycle of every three conversion cycles, and sampling the amplified previous residue value on the fifth capacitor at a third conversion cycle of every three conversion cycles. In such embodiments, a summed voltage includes a sum of the output of CDAC 110, the sampled amplified previous residue value sampled by the first sampling circuit and the sampled amplified previous residue value sampled by the second sampling circuit; and the previous residue signal comprises a sum of the sampled amplified previous residue value sampled by the first sampling circuit, and the sampled amplified previous residue value sampled by the second sampling circuit.

In some embodiments, CIFF path 320 shown in FIG. 3B may be referred to as a filter circuit and capacitors $C_{IIR}$ and $C_{INT}$ may be respectively referred to as a sixth capacitor and a seventh capacitor. In such embodiments, performing the analog-to-digital conversion may further include sampling the amplified previous residue value on the sixth capacitor, and after sampling the amplified previous residue value on the sixth capacitor, coupling the sixth capacitor with the seventh capacitor. Here, the summed voltage may include a sum of the output of CDAC 110, the sampled amplified previous residue value sampled by the first sampling circuit, the sampled amplified previous residue value sampled by the second sampling circuit, and a voltage on the seventh capacitor.

In some embodiments, delay element 422 shown in FIG. 4B may be referred to as a third sampling circuit and capacitors AY and BY may be respectively referred to as an eighth capacitor and a ninth capacitor. In such embodiments, performing the analog-to-digital conversion may further include sampling a sum of the amplified previous residue, a previous output voltage of the first sampling circuit and a previous voltage of the ninth capacitor on the eighth capacitor during even conversion cycles, and sampling a sum of the amplified previous residue, the previous output voltage of the first sampling circuit and a previous voltage of the eighth capacitor on the ninth capacitor during odd conversion cycles. Here the summed voltage includes a sum of the output of CDAC 110, the sampled amplified previous residue value sampled by the first sampling circuit, and the sampled sum sampled by the third sampling circuit.

Embodiments of the present invention are summarized here. Other embodiments can also be understood from the entirety of the specification and the claims filed herein.

Example 1. A noise shaping successive approximation analog-to-digital converter (ADC), including: a digital-to-analog converter (DAC); a multi-input comparator with a first input coupled to the DAC; a multi-input amplifier including a first input coupled to the DAC, and a second input coupled to a second input of the multi-input comparator; and a first delay element having an input coupled to an output of the multi-input amplifier and an output coupled to the second input of the multi-input amplifier and to the second input of the multi-input comparator.

Example 2. The ADC of example 1, where the first delay element includes: a first capacitor; and a second capacitor, where the first capacitor and the second capacitor are configured to be alternatingly coupled between the output of the multi-input amplifier and both the second input of the multi-input comparator and the second input of the multi-input amplifier, where in a first state, the first capacitor is connected to the output of the multi-input amplifier while the second capacitor is connected to the second input of the multi-input comparator and the second input of the multi-input amplifier, and in a second state, the second capacitor is connected to the output of the multi-input amplifier while the first capacitor is connected to the second input of the multi-input comparator and the second input of the multi-input amplifier.

Example 3. The ADC of one of examples 1 or 2, further including a second delay element including an input coupled to the output of the multi-input amplifier and an output connected to a third input of both the multi-input amplifier and the multi-input comparator, where the second delay element has a delay that is twice as long as a delay of the first delay element.

Example 4. The ADC of example 3, where the second delay element includes: a first capacitor, a second capacitor, and a third capacitor configured to be alternatingly coupled between the output of the multi-input amplifier and to both the third input of both the multi-input amplifier and the third input of the multi-input comparator, where in a first state, the first capacitor is connected to the output of the multi-input amplifier, the second capacitor is connected to the third input of the multi-input comparator and the third input of the multi-input amplifier, and the third capacitor is idle, in a second state the second capacitor is connected to the output of the multi-input amplifier, the third capacitor is connected to the third input of the multi-input comparator and the third input of the multi-input amplifier, and the first capacitor is idle, and in a third state the third capacitor is connected to the output of the multi-input amplifier, the first capacitor is connected to the third input of the multi-input comparator and the third input of the multi-input amplifier, and the second capacitor is idle.

Example 5. The ADC of one of examples 1 to 4, further including a cascaded integrator with feed-forward (CIFF) branch coupled between the output of the multi-input amplifier and a fourth input of the multi-input comparator.

Example 6. The ADC of example 5, where the CIFF branch includes a plurality of cascaded delay circuits each including a capacitor coupled to a respective switch.

Example 7. The ADC of one of examples 1 to 6, further including: a further multi-input amplifier including: a first input coupled to the first input of the multi-input amplifier and to the first input of the multi-input comparator, a second input coupled to an output of the first delay element and to the second input of the multi-input comparator, and a third input coupled to a third input of the multi-input comparator; and a further delay element including an input coupled to the output of the further multi-input amplifier and an output coupled to the third input of the multi-input comparator and to a third input of the further multi-input amplifier.

Example 8. The ADC of one of examples 1 to 7, further including a successive approximation register (SAR) with an input coupled to an output of the multi-input comparator and an output coupled to the DAC.

Example 9. The ADC of example 8, further including a controller configured to: (a) trigger the first delay element; (b) cause the SAR and the multi-input comparator to perform a successive approximation of an input voltage after triggering the first delay element; and repeat steps (a) and (b).

Example 10. The ADC of one of examples 1 to 9, where the DAC includes a capacitor array DAC.

Example 11. The ADC of one of examples 1 to 10, where: the multi-input amplifier includes a first differential amplifier; the multi-input comparator includes a second differential pre-amplifier followed by a comparator circuit; and the capacitor array DAC includes a first capacitor array DAC coupled to positive phase inputs of the first differential amplifier and the second differential amplifier, and a second capacitor array coupled to negative phase inputs of the first differential amplifier and the second differential amplifier.

Example 12. The ADC of example 11, where the first differential amplifier includes a floating inverter dynamic amplifier (FIDA).

Example 13. The ADC of one of examples 1 to 12, where a first gain from the first input of the multi-input amplifier to the output of the multi-input amplifier is different from a second gain from the second input of the multi-input amplifier to the output of the multi-input amplifier.

Example 14. A method including: performing an analog-to-digital conversion including: using a first sampling circuit including a first capacitor and a second capacitor, sampling an amplified previous residue value on the first capacitor at even conversion cycles and sampling the amplified previous residue value on the second capacitor at odd conversion cycles, sampling an input voltage on a capacitor array digital-to-analog converter (CDAC), performing a successive approximation analog-to-digital conversion on the sampled input voltage including: using a multi-input comparator, iteratively comparing a summed voltage with a threshold, and adjusting an input code of the CDAC based on the comparing, where the summed voltage includes a sum of an output of the CDAC and the sampled amplified previous residue value sampled by the first sampling circuit, and after performing the successive approximation analog-to-digital conversion, amplifying a weighted sum of a present residue value at the output of the CDAC and a previous residue signal using a multi-input amplifier, where the previous residue signal includes a sampled amplified previous residue value sampled by the first sampling circuit.

Example 15. The method of example 14, further including repeating performing the analog-to-digital conversion, where the weighted sum becomes the amplified previous residue value in an immediately subsequent analog-to-digital conversion.

Example 16. The method of one of examples 14 or 15, where: performing the analog-to-digital conversion further includes using a second sampling circuit including a third capacitor, a fourth capacitor, and a fifth capacitor: sampling the amplified previous residue value on the third capacitor at a first conversion cycle of every three conversion cycles, sampling the amplified previous residue value on the fourth capacitor at a second conversion cycle of every three conversion cycles, and sampling the amplified previous residue value on the fifth capacitor at a third conversion cycle of every three conversion cycles; the summed voltage includes a sum of the output of the CDAC, the sampled amplified previous residue value sampled by the first sampling circuit, and the sampled amplified previous residue value sampled by the second sampling circuit; and the previous residue signal includes a sum of the sampled amplified previous residue value sampled by the first sampling circuit, and the sampled amplified previous residue value sampled by the second sampling circuit.

Example 17. The method of example 16, where: performing the analog-to-digital conversion further includes using a filter circuit including a sixth capacitor and a seventh capacitor: sampling the amplified previous residue value on the sixth capacitor, and after sampling the amplified previous residue value on the sixth capacitor, coupling the sixth capacitor with the seventh capacitor; and the summed voltage includes a sum of the output of the CDAC, the sampled amplified previous residue value sampled by the first sampling circuit, the sampled amplified previous residue value sampled by the second sampling circuit, and a voltage on the seventh capacitor.

Example 18. The method of one of examples 14 to 17, where: performing the analog-to-digital conversion further includes using a third sampling circuit including an eighth capacitor and a ninth capacitor: sampling a sum of the output of the CDAC, a previous output voltage of the first sampling circuit and a previous voltage of the ninth capacitor on the eighth capacitor during even conversion cycles, and sampling a sum of the output of the CDAC, the previous output voltage of the first sampling circuit and a previous voltage of the eighth capacitor on the ninth capacitor during odd conversion cycles; and the summed voltage includes a sum of the output of the CDAC, the sampled amplified previous residue value sampled by the first sampling circuit, and the sampled sum sampled by the third sampling circuit.

Example 19. An analog-to-digital converter including: a first sampling circuit including a first capacitor and a second capacitor, the first sampling circuit configured to sample an amplified previous residue value on the first capacitor at even conversion cycles, and sample the amplified previous residue value on the second capacitor at odd conversion cycles, a successive approximation analog-to-digital converter including a capacitor array digital-to-analog converter (CDAC), a multi-input comparator, and a successive approximation register, the successive approximation analog-to-digital converter configured to perform a successive approximation analog-to-digital conversion on a sampled input voltage by: iteratively comparing a summed voltage with a threshold, and adjusting an input code of the CDAC based on the comparing, where the summed voltage includes a sum of an output of the CDAC and the sampled amplified previous residue value sampled by the first sampling circuit; and a multi-input amplifier configured to amplify a present residue value at the output of the CDAC and a previous residue signal, where the previous residue signal includes a sampled amplified previous residue value sampled by the first sampling circuit.

Example 20. The analog-to-digital converter of example 19, further including a second sampling circuit including a third capacitor, a fourth capacitor, and a fifth capacitor, the second sampling circuit configured to: sample the amplified previous residue value on the third capacitor at a first conversion cycle of every three conversion cycles; sample the amplified previous residue value on the fourth capacitor at a second conversion cycle of every three conversion cycles; and sample the amplified previous residue value on the fifth capacitor at a third conversion cycle of every three conversion cycles, where the summed voltage includes a sum of the output of the CDAC, the sampled amplified previous residue value sampled by the first sampling circuit, and the sampled amplified previous residue value sampled by the second sampling circuit, and the previous residue signal includes a sum of the sampled amplified previous residue value sampled by the first sampling circuit, and the sampled amplified previous residue value sampled by the second sampling circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A noise shaping successive approximation analog-to-digital converter (ADC), comprising:
   a digital-to-analog converter (DAC);
   a multi-input comparator with a first input coupled to the DAC;
   a multi-input amplifier comprising a first input coupled to the DAC, and a second input coupled to a second input of the multi-input comparator; and
   a first delay element having an input coupled to an output of the multi-input amplifier and an output coupled to the second input of the multi-input amplifier and to the second input of the multi-input comparator.
2. The ADC of claim 1, wherein the first delay element comprises:
   a first capacitor; and
   a second capacitor, wherein the first capacitor and the second capacitor are configured to be alternatingly coupled between the output of the multi-input amplifier and both the second input of the multi-input comparator and the second input of the multi-input amplifier, wherein
      in a first state, the first capacitor is connected to the output of the multi-input amplifier while the second capacitor is connected to the second input of the multi-input comparator and the second input of the multi-input amplifier, and in a second state, the second capacitor is connected to the output of the multi-input amplifier while the first capacitor is connected to the second input of the multi-input comparator and the second input of the multi-input amplifier.

3. The ADC of claim 1, further comprising a second delay element comprising an input coupled to the output of the multi-input amplifier and an output connected to a third input of both the multi-input amplifier and the multi-input comparator, wherein the second delay element has a delay that is twice as long as a delay of the first delay element.

4. The ADC of claim 3, wherein the second delay element includes:
a first capacitor,
a second capacitor, and
a third capacitor configured to be alternatingly coupled between the output of the multi-input amplifier and to both the third input of the multi-input amplifier and the third input of the multi-input comparator, wherein
in a first state, the first capacitor is connected to the output of the multi-input amplifier, the second capacitor is connected to the third input of the multi-input comparator and the third input of the multi-input amplifier, and the third capacitor is idle,
in a second state the second capacitor is connected to the output of the multi-input amplifier, the third capacitor is connected to the third input of the multi-input comparator and the third input of the multi-input amplifier, and the first capacitor is idle, and
in a third state the third capacitor is connected to the output of the multi-input amplifier, the first capacitor is connected to the third input of the multi-input comparator and the third input of the multi-input amplifier, and the second capacitor is idle.

5. The ADC of claim 1, further comprising a cascaded integrator with feed-forward (CIFF) branch coupled between the output of the multi-input amplifier and a fourth input of the multi-input comparator.

6. The ADC of claim 5, wherein the CIFF branch comprises a plurality of cascaded delay circuits, each comprising a capacitor coupled to a respective switch.

7. The ADC of claim 1, further comprising:
a further multi-input amplifier comprising:
a first input coupled to the first input of the multi-input amplifier and to the first input of the multi-input comparator,
a second input coupled to an output of the first delay element and to the second input of the multi-input comparator, and
a third input coupled to a third input of the multi-input comparator; and
a further delay element comprising an input coupled to the output of the further multi-input amplifier and an output coupled to the third input of the multi-input comparator and to a third input of the further multi-input amplifier.

8. The ADC of claim 1, further comprising a successive approximation register (SAR) with an input coupled to an output of the multi-input comparator and an output coupled to the DAC.

9. The ADC of claim 8, further comprising a controller configured to:
(a) trigger the first delay element;
(b) cause the SAR and the multi-input comparator to perform a successive approximation of an input voltage after triggering the first delay element; and
repeat steps (a) and (b).

10. The ADC of claim 1, wherein the DAC comprises a capacitor array DAC.

11. The ADC of claim 10, wherein:
the multi-input amplifier comprises a first differential amplifier;
the multi-input comparator comprises a second differential amplifier followed by a comparator circuit; and
the capacitor array DAC comprises a first capacitor array DAC coupled to positive phase inputs of the first differential amplifier and the second differential amplifier, and a second capacitor array coupled to negative phase inputs of the first differential amplifier and the second differential amplifier.

12. The ADC of claim 11, wherein the first differential amplifier comprises a floating inverter dynamic amplifier (FIDA).

13. The ADC of claim 1, wherein a first gain from the first input of the multi-input amplifier to the output of the multi-input amplifier is different from a second gain from the second input of the multi-input amplifier to the output of the multi-input amplifier.

14. A method comprising:
performing an analog-to-digital conversion comprising:
using a first sampling circuit comprising a first capacitor and a second capacitor, sampling an amplified previous residue value on the first capacitor at even conversion cycles and sampling the amplified previous residue value on the second capacitor at odd conversion cycles,
sampling an input voltage on a capacitor array digital-to-analog converter (CDAC),
performing a successive approximation analog-to-digital conversion on the sampled input voltage comprising: using a multi-input comparator, iteratively comparing a summed voltage with a threshold, and adjusting an input code of the CDAC based on the comparing, wherein the summed voltage comprises a sum of an output of the CDAC and the sampled amplified previous residue value sampled by the first sampling circuit, and
after performing the successive approximation analog-to-digital conversion, amplifying a weighted sum of a present residue value at the output of the CDAC and a previous residue signal using a multi-input amplifier, wherein the previous residue signal comprises a sampled amplified previous residue value sampled by the first sampling circuit.

15. The method of claim 14, further comprising repeating performing the analog-to-digital conversion, wherein the weighted sum becomes the amplified previous residue value in an immediately subsequent analog-to-digital conversion.

16. The method of claim 14, wherein:
performing the analog-to-digital conversion further comprises using a second sampling circuit comprising a third capacitor, a fourth capacitor, and a fifth capacitor:
sampling the amplified previous residue value on the third capacitor at a first conversion cycle of every three conversion cycles,
sampling the amplified previous residue value on the fourth capacitor at a second conversion cycle of every three conversion cycles, and
sampling the amplified previous residue value on the fifth capacitor at a third conversion cycle of every three conversion cycles;
the summed voltage comprises a sum of the output of the CDAC, the sampled amplified previous residue value sampled by the first sampling circuit, and the sampled amplified previous residue value sampled by the second sampling circuit; and the previous residue signal comprises a sum of the sampled amplified previous residue value sampled by the first sampling circuit, and the sampled amplified previous residue value sampled by the second sampling circuit.

17. The method of claim 16, wherein:

performing the analog-to-digital conversion further comprises using a filter circuit comprising a sixth capacitor and a seventh capacitor:

sampling the amplified previous residue value on the sixth capacitor, and after sampling the amplified previous residue value on the sixth capacitor, coupling the sixth capacitor with the seventh capacitor; and the summed voltage comprises a sum of the output of the CDAC, the sampled amplified previous residue value sampled by the first sampling circuit, the sampled amplified previous residue value sampled by the second sampling circuit, and a voltage on the seventh capacitor.

18. The method of claim 14, wherein:

performing the analog-to-digital conversion further comprises using a third sampling circuit comprising an eighth capacitor and a ninth capacitor:

sampling a sum of the output of the CDAC, a previous output voltage of the first sampling circuit and a previous voltage of the ninth capacitor on the eighth capacitor during even conversion cycles, and sampling a sum of the output of the CDAC, the previous output voltage of the first sampling circuit and a previous voltage of the eighth capacitor on the ninth capacitor during odd conversion cycles; and the summed voltage comprises a sum of the output of the CDAC, the sampled amplified previous residue value sampled by the first sampling circuit, and the sampled sum sampled by the third sampling circuit.

19. An analog-to-digital converter comprising:

a first sampling circuit comprising a first capacitor and a second capacitor, the first sampling circuit configured to sample an amplified previous residue value on the first capacitor at even conversion cycles, and sample the amplified previous residue value on the second capacitor at odd conversion cycles, a successive approximation analog-to-digital converter comprising a capacitor array digital-to-analog converter (CDAC), a multi-input comparator, and a successive approximation register, the successive approximation analog-to-digital converter configured to perform a successive approximation analog-to-digital conversion on a sampled input voltage by:

iteratively comparing a summed voltage with a threshold, and adjusting an input code of the CDAC based on the comparing, wherein the summed voltage comprises a sum of an output of the CDAC and the sampled amplified previous residue value sampled by the first sampling circuit; and a multi-input amplifier configured to amplify a present residue value at the output of the CDAC and a previous residue signal, wherein the previous residue signal comprises a sampled amplified previous residue value sampled by the first sampling circuit.

20. The analog-to-digital converter of claim 19, further comprising a second sampling circuit comprising a third capacitor, a fourth capacitor, and a fifth capacitor, the second sampling circuit configured to:

sample the amplified previous residue value on the third capacitor at a first conversion cycle of every three conversion cycles;

sample the amplified previous residue value on the fourth capacitor at a second conversion cycle of every three conversion cycles; and sample the amplified previous residue value on the fifth capacitor at a third conversion cycle of every three conversion cycles, wherein the summed voltage comprises a sum of the output of the CDAC, the sampled amplified previous residue value sampled by the first sampling circuit, and the sampled amplified previous residue value sampled by the second sampling circuit, and the previous residue signal comprises a sum of the sampled amplified previous residue value sampled by the first sampling circuit, and the sampled amplified previous residue value sampled by the second sampling circuit.

* * * * *